United States Patent
Dutta et al.

(10) Patent No.: US 9,053,810 B2
(45) Date of Patent: Jun. 9, 2015

(54) DEFECT OR PROGRAM DISTURB DETECTION WITH FULL DATA RECOVERY CAPABILITY

(71) Applicant: SanDisk Technologies Inc., Plano, TX (US)

(72) Inventors: Deepanshu Dutta, Santa Clara, CA (US); Dana Lee, Saratoga, CA (US); Yan Li, Milpitas, CA (US); Grishma Shah, San Jose, CA (US); Farookh Moogat, Fremont, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 144 days.

(21) Appl. No.: 13/790,469

(22) Filed: Mar. 8, 2013

(65) Prior Publication Data
US 2014/0254264 A1    Sep. 11, 2014

(51) Int. Cl.
| | | |
|---|---|---|
| G11C 16/04 | (2006.01) | |
| G11C 16/34 | (2006.01) | |
| G11C 16/10 | (2006.01) | |
| G11C 11/56 | (2006.01) | |

(52) U.S. Cl.
CPC .......... G11C 16/3459 (2013.01); G11C 16/10 (2013.01); G11C 11/5628 (2013.01); *G11C 2211/5621* (2013.01); *G11C 2211/5642* (2013.01); G11C 16/0483 (2013.01); G11C 16/3431 (2013.01)

(58) Field of Classification Search
USPC ............ 365/185.03, 185.26, 189.01, 185.22, 365/185.25
See application file for complete search history.

(56) References Cited

U.S. PATENT DOCUMENTS

| | | | |
|---|---|---|---|
| 6,714,453 B2 | 3/2004 | Cavaleri et al. | |
| 6,914,823 B2 | 7/2005 | Chen et al. | |
| 7,345,928 B2 | 3/2008 | Li | |
| 7,796,430 B2 * | 9/2010 | Lutze et al. | 365/185.03 |
| 7,898,868 B2 * | 3/2011 | Guterman et al. | 365/185.21 |
| 7,903,459 B2 | 3/2011 | Yu et al. | |
| 7,948,790 B2 * | 5/2011 | Tsukamoto et al. | 365/148 |
| 7,957,187 B2 | 6/2011 | Mokhlesi et al. | |
| 7,978,520 B2 * | 7/2011 | Mokhlesi et al. | 365/185.19 |
| 7,978,530 B2 * | 7/2011 | Lutze et al. | 365/185.24 |
| 8,045,375 B2 * | 10/2011 | Hemink | 365/185.03 |
| 8,073,648 B2 * | 12/2011 | Shlick et al. | 702/117 |
| 8,111,550 B2 | 2/2012 | Sarin et al. | |
| 8,116,160 B2 | 2/2012 | Hwang | |

(Continued)

OTHER PUBLICATIONS

International Search Report & The Written Opinion of the International Searching Authority dated Aug. 6, 2014, International Patent Application No. PCT/US2014/019730.

*Primary Examiner* — Huan Hoang
*Assistant Examiner* — Minh Dinh
(74) *Attorney, Agent, or Firm* — Vierra Magen Marcus LLP

(57) ABSTRACT

A programming operation for a set of non-volatile storage elements determines whether the storage elements have been programmed properly after a program-verify test is passed and a program status=pass is issued. Write data is reconstructed from sets of latches associated with the storage elements using logical operations optionally one or more reconstruction read operations. Normal read operations are also performed to obtain read data. A number of mismatches between the read data and the reconstructed write data is determined, and determination is made as to whether rewriting of the write data is required based on the number of the mismatches.

20 Claims, 17 Drawing Sheets

(56) References Cited

U.S. PATENT DOCUMENTS 8,248,850 B2 * 8/2012 Dutta et al. ............. 365/185.09
8,305,807 B2 * 11/2012 Shah et al. ............. 365/185.09
8,307,241 B2 * 11/2012 Avila et al. ................. 714/6.2
2010/0106893 A1 4/2010 Fasoli et al.

* cited by examiner

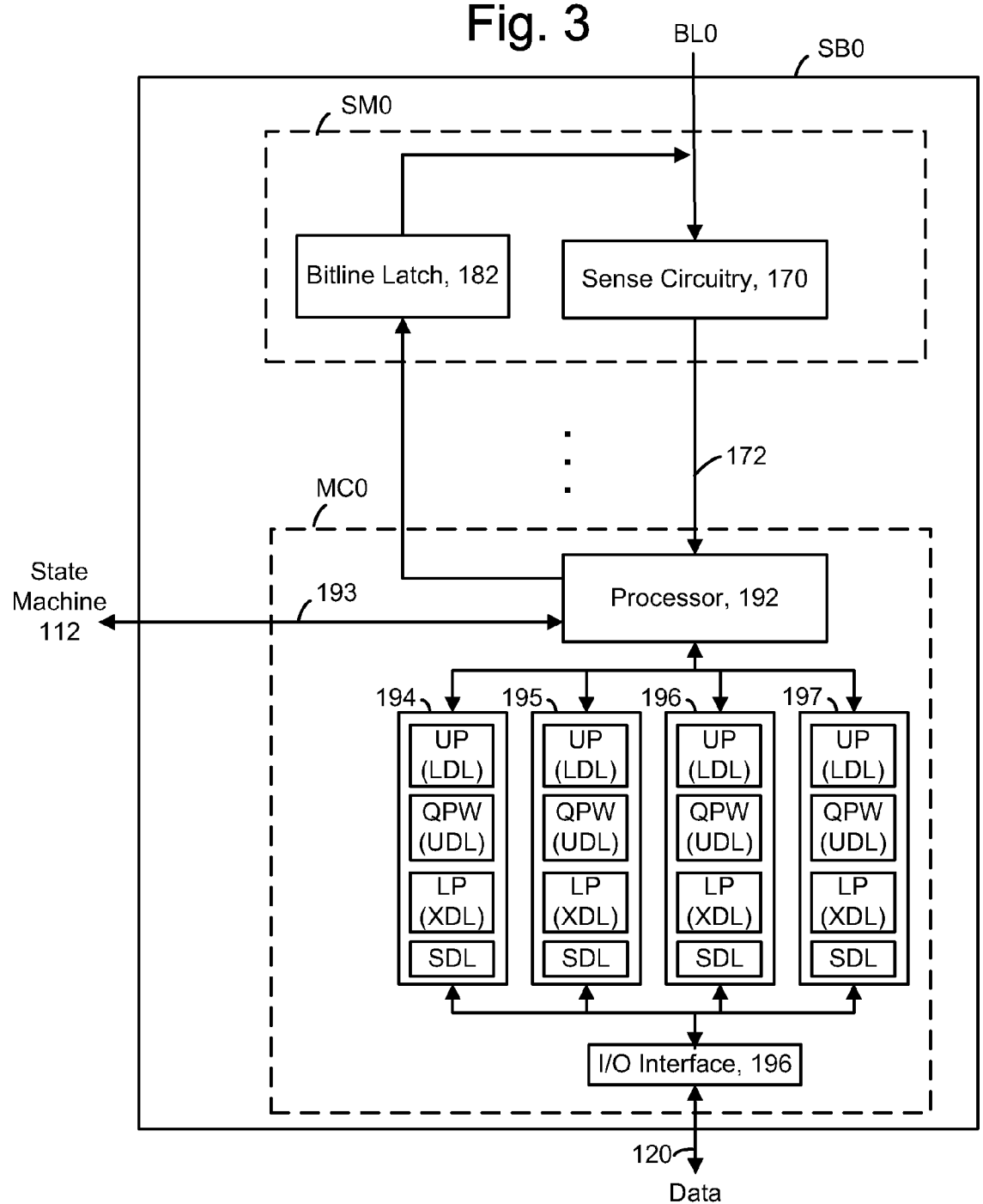

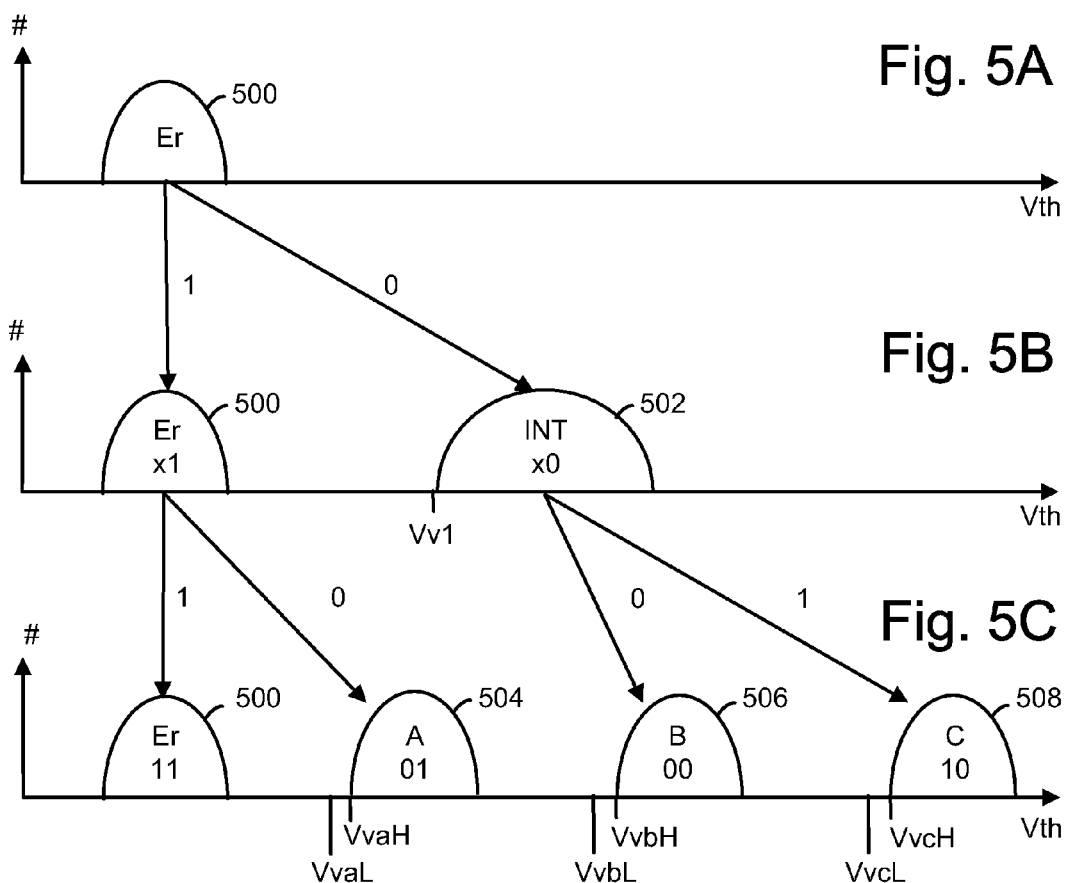

Fig. 9A

| Latch: | C0 Er | C1 An | C2 Ag | C0 Ai | C3 Bn | C4 Bg | C0 Bi | C5 Cn | C6 Ci | C7 Unused#1 | C8 Unused#2 |
|---|---|---|---|---|---|---|---|---|---|---|---|
| Upper (LDL) | 1 | 0 | 0 | 1 | 0 | 0 | 1 | 0 | 1 | 1 | 1 |
| QPW (UDL)   | 1 | 0 | 1 | 1 | 0 | 1 | 1 | 0 | 1 | 0 | 1 |
| Lower (XDL) | 1 | 1 | 1 | 1 | 0 | 0 | 1 | 0 | 1 | 1 | 0 |

Fig. 9B

| Latch: | Er | An | Ag | Ai | Bn | Bg | Bi | Cn | Ci | Unused#1 |
|---|---|---|---|---|---|---|---|---|---|---|
| Upper (LDL) | 1 | 0 | 0 | 1 | 0 | 0 | 1 | 0 | 1 | 1 |
| QPW (UDL)   | 1 | 0 | 1 | 1 | 0 | 1 | 1 | 0 | 1 | 0 |
| Lower (XDL) | 1 | 1 | 1 | 1 | 0 | 0 | 0 | 0 | 0 | 1 |

Fig. 10A

| Latch: | Er | An | Ag | Ai | Bn | Bg | Bi | Cn | Ci |
|---|---|---|---|---|---|---|---|---|---|
| Upper (LDL) | 1 | 0 | n/a | 1 | 0 | 0 | 1 | 1 | 0 |
| QPW (UDL)   | 1 | 0 | n/a | 0 | 0 | 1 | 1 | 0 | 0 |
| Lower (XDL) | 1 | 1 | n/a | 1 | 0 | 0 | 0 | 0 | 1 |

Fig. 10B

| Latch: | Er | An | Ag | Ai | Bn | Bg | Bi | Cn | Ci |
|---|---|---|---|---|---|---|---|---|---|
| Upper (LDL) | 1 | 0 | 0 | 1 | 0 | 0 | 1 | 1 | 1 |
| QPW (UDL)   | 1 | 0 | 1 | 0 | 0 | 1 | 1 | 0 | 1 |
| Lower (XDL) | 1 | 1 | 1 | 1 | 0 | 0 | 0 | 0 | 1 |

| Original write data | | | | |
|---|---|---|---|---|
| Latch: | Er | A | B | C |
| Upper (LDL) | 1 | 0 | 0 | 1 |
| QPW (UDL) | x | x | x | x |
| Lower (XDL) | 1 | 1 | 0 | 0 |

1110 →

| End of programming | | | | |
|---|---|---|---|---|
| Latch: | Er | A | B | C |
| Upper (LDL) | 1 | 1 | 1 | 0 |
| QPW (UDL) | 1 | 0 | 1 | 0 |
| Lower (XDL) | 1 | 1 | 0 | 1 |

1120 →

| XDL = XDL & LDL | | | | |
|---|---|---|---|---|
| Latch: | Er | A | B | C |
| Upper (LDL) | 1 | 1 | 1 | 0 |
| QPW (UDL) | 1 | 0 | 1 | 0 |
| Lower (XDL) | 1 | 1 | 0 | 0 |

1130 →

| LDL = LDL & UDL | | | | |
|---|---|---|---|---|
| Latch: | Er | A | B | C |
| Upper (LDL) | 1 | 0 | 1 | 0 |
| QPW (UDL) | 1 | 0 | 1 | 0 |
| Lower (XDL) | 1 | 1 | 0 | 0 |

1140 →

| LDL = LDL XNOR XDL | | | | |
|---|---|---|---|---|
| Latch: | Er | A | B | C |
| Upper (LDL) | 1 | 0 | 0 | 1 |
| QPW (UDL) | x | x | x | x |
| Lower (XDL) | 1 | 1 | 0 | 0 |

Original write data

| Latch: | Er | A | B | C |
|---|---|---|---|---|
| Upper (LDL) | 1 | 0 | 0 | 1 |
| QPW (UDL) | x | x | x | x |
| Lower (XDL) | 1 | 1 | 0 | 0 |

Fig. 12A

End of programming

| Latch: | Er | A | B | C |
|---|---|---|---|---|
| Upper (LDL) | 1 | 1 | 1 | 1 |
| QPW (UDL) | 1 | 0 | 1 | 1 |
| Lower (XDL) | 1 | 1 | 0 | 1 |

Fig. 12B (1) Reset LDL, and (2) LDL = UDL; Reset UDL.

| Latch: | Er | A | B | C |
|---|---|---|---|---|
| Upper (LDL) | 1 | 0 | 1 | 1 |
| QPW (UDL) | x | x | x | x |
| Lower (XDL) | 1 | 1 | 0 | 1 |

Fig. 12C

LDL = LDL&XDL

| Latch: | Er | A | B | C |
|---|---|---|---|---|
| Upper (LDL) | 1 | 0 | 0 | 1 |
| QPW (UDL) | x | x | x | x |
| Lower (XDL) | 1 | 1 | 0 | 1 |

Fig. 12D

B-READ

| Latch: | Er | A | B | C |
|---|---|---|---|---|
| Upper (LDL) | 1 | 0 | 0 | 1 |
| QPW (UDL) | x | x | x | x |
| Lower (XDL) | 1 | 1 | 0 | 1 |
| Read (SDL) | 0 | 0 | 1 | 1 |

1200 →

UDL = SDL & LDL

| Latch: | Er | A | B | C |
|---|---|---|---|---|
| Upper (LDL) | 1 | 0 | 0 | 1 |
| QPW (UDL) | 0 | 0 | 0 | 1 |
| Lower (XDL) | 1 | 1 | 0 | 1 |
| Read (SDL) | 0 | 0 | 1 | 1 |

1202 →

XDL = UDL XOR XDL

| Latch: | Er | A | B | C |
|---|---|---|---|---|
| Upper (LDL) | 1 | 0 | 0 | 1 |
| QPW (UDL) | x | x | x | x |
| Lower (XDL) | 1 | 1 | 0 | 0 |
| Read (SDL) | 0 | 0 | 1 | 1 |

| Latch:      | Er | An | Ai | Bn | Bq | Bi | Cn | Ci |
|-------------|----|----|----|----|----|----|----|----|
| Upper (LDL) | 1  | 0  | 1  | 0  | 0  | 1  | 1  | 0  |
| QPW (UDL)   | 1  | 1  | 0  | 0  | 1  | 1  | 0  | 0  |
| Lower (XDL) | 1  | 1  | 1  | 0  | 0  | 0  | 0  | 1  |

Fig. 13A

SDL=LDL

| Latch:      | Er | An | Ai | Bn | Bq | Bi | Cn | Ci |
|-------------|----|----|----|----|----|----|----|----|
| Upper (LDL) | 1  | 0  | 1  | 0  | 0  | 1  | 1  | 0  |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 1 | 0 | 1 | 0 | 0 | 1 | 1 | 0 |

Fig. 13B

LDL=LDL&UDL&XDL

| Latch:      | Er | An | Ai | Bn | Bq | Bi | Cn | Ci |
|-------------|----|----|----|----|----|----|----|----|
| Upper (LDL) | 1  | 0  | 0 | 0  | 0  | 0 | 0 | 0  |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 1  | 0  | 1  | 0  | 0  | 1  | 1  | 0  |

Fig. 13C

LDL=LDL|(~UDL&XDL&~SDL)

| Latch:      | Er | An | Ai | Bn | Bq | Bi | Cn | Ci |
|-------------|----|----|----|----|----|----|----|----|
| Upper (LDL) | 1  | 0  | 0  | 0  | 0  | 0  | 0  | 1 |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 1  | 0  | 1  | 0  | 0  | 1  | 1  | 0  |

Fig. 13D

SDL=SDL&~XDL

| Latch:      | Er | An | Ai | Bn | Bq | Bi | Cn | Ci |
|-------------|----|----|----|----|----|----|----|----|
| Upper (LDL) | 1  | 0  | 0  | 0  | 0  | 0  | 0  | 1  |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 0 | 0 | 0 | 0  | 0  | 1  | 1  | 0  |

Fig. 13E

LDL=LDL|(~UDL&SDL)

| Latch:      | Er | An | Ai | Bn | Bq | Bi | Cn | Ci |
|-------------|----|----|----|----|----|----|----|----|
| Upper (LDL) | 1  | 0  | 0  | 0  | 0  | 0  | 1 | 1  |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 0  | 0  | 0  | 0  | 0  | 1  | 1  | 0  |

Fig. 13F

SDL=LDL&~UDL

| Latch:      | Er | An | Ai | Bn | Bq | Bi | Cn | Ci |
|-------------|----|----|----|----|----|----|----|----|
| Upper (LDL) | 1  | 0  | 0  | 0  | 0  | 0  | 1  | 1  |
| QPW (UDL)   | 1  | 1  | 0  | 0  | 1  | 1  | 0  | 0  |
| Lower (XDL) | 1  | 1  | 1  | 0  | 0  | 0  | 0  | 1  |
| Read (SDL)  | 0  | 0  | 0  | 0  | 0 | 1  | 1  | 1 |

Fig. 13G

XDL=XDL&~SDL

| Latch:      | Er | An | Ai | Bn | Bq | Bi | Cn | Ci |
|-------------|----|----|----|----|----|----|----|----|
| Upper (LDL) | 1  | 0  | 0  | 0  | 0  | 0  | 1  | 1  |
| QPW (UDL)   | 1  | 1  | 0  | 0  | 1  | 1  | 0  | 0  |
| Lower (XDL) | 1  | 1  | 1  | 0  | 0  | 0  | 0  | 0 |
| Read (SDL)  | 0  | 0  | 0  | 0  | 0  | 0  | 1  | 1  |

| Latch: | Er | An | Aq | Ai | Bn | Bq | Bi | Cn | Ci |
|---|---|---|---|---|---|---|---|---|---|
| Upper (LDL) | 1 | 0 | 0 | 1 | 0 | 0 | 1 | 1 | 1 |
| QPW (UDL) | 1 | 0 | 1 | 0 | 0 | 1 | 1 | 0 | 1 |
| Lower (XDL) | 1 | 1 | 1 | 1 | 0 | 0 | 0 | 0 | 1 |

Fig. 14B

SDL=LDL

| Latch: | Er | An | Aq | Ai | Bn | Bq | Bi | Cn | Ci |
|---|---|---|---|---|---|---|---|---|---|
| Upper (LDL) | 1 | 0 | 0 | 1 | 0 | 0 | 1 | 1 | 1 |
| QPW (UDL) | 1 | 0 | 1 | 0 | 0 | 1 | 1 | 0 | 1 |
| Lower (XDL) | 1 | 1 | 1 | 1 | 0 | 0 | 0 | 0 | 1 |
| Read (SDL) | 1 | 0 | 0 | 1 | 0 | 0 | 1 | 1 | 1 |

Fig. 14C

LDL=LDL&UDL&XDL

| Latch: | Er | An | Aq | Ai | Bn | Bq | Bi | Cn | Ci |
|---|---|---|---|---|---|---|---|---|---|
| Upper (LDL) | 1 | 0 | 0 | 0 | 0 | 0 | 0 | 0 | 1 |
| QPW (UDL) | 1 | 0 | 1 | 0 | 0 | 1 | 1 | 0 | 1 |
| Lower (XDL) | 1 | 1 | 1 | 1 | 0 | 0 | 0 | 0 | 1 |
| Read (SDL) | 1 | 0 | 0 | 1 | 0 | 0 | 1 | 1 | 1 |

Fig. 14D

LDL=LDL|(~UDL&~XDL&SDL)

| Latch: | Er | An | Aq | Ai | Bn | Bq | Bi | Cn | Ci |
|---|---|---|---|---|---|---|---|---|---|
| Upper (LDL) | 1 | 0 | 0 | 0 | 0 | 0 | 0 | 1 | 1 |
| QPW (UDL) | 1 | 0 | 1 | 0 | 0 | 1 | 1 | 0 | 1 |
| Lower (XDL) | 1 | 1 | 1 | 1 | 0 | 0 | 0 | 0 | 1 |
| Read (SDL) | 1 | 0 | 0 | 1 | 0 | 0 | 1 | 1 | 1 |

Fig. 14E

B-READ INTO SDL

| Latch: | Er | An | Aq | Ai | Bn | Bq | Bi | Cn | Ci |
|---|---|---|---|---|---|---|---|---|---|
| Upper (LDL) | 1 | 0 | 0 | 0 | 0 | 0 | 0 | 1 | 1 |
| QPW (UDL) | 1 | 0 | 1 | 0 | 0 | 1 | 1 | 0 | 1 |
| Lower (XDL) | 1 | 1 | 1 | 1 | 0 | 0 | 0 | 0 | 1 |
| Read (SDL) | 0 | 0 | 0 | 0 | 0 | 1 | 1 | 1 | 1 |

Fig. 14F

XDL=XDL&~SDL

| Latch: | Er | An | Aq | Ai | Bn | Bq | Bi | Cn | Ci |
|---|---|---|---|---|---|---|---|---|---|
| Upper (LDL) | 1 | 0 | 0 | 0 | 0 | 0 | 0 | 1 | 1 |
| QPW (UDL) |  |  |  |  |  |  |  |  |  |
| Lower (XDL) | 1 | 1 | 1 | 1 | 0 | 0 | 0 | 0 | 0 |
| Read (SDL) |  |  |  |  |  |  |  |  |  |

```
#redundancies/reads=0, #qpw states=1

Case 1A
C0    C1         C2    C3    C4    C5    C6         C7
Er    An         Ai    Bn    Bq    Bi    Cn         Ci Case 1B
C0    C1    C2   C3    C4          C5    C6         C7
Er    An    Aq   Ai    Bn          Bi    Cn         Ci Case 1C
C0    C1         C2    C3          C4    C5    C6   C7
Er    An         Ai    Bn          Bi    Cn    Cq   Ci
```

Fig. 15A

```
#redundancies/reads=1, #qpw states=2

Case 2A: reads: er/c
C0    C1         C2    C3    C4    C5    C6    C7   C0
Er    An         Ai    Bn    Bq    Bi    Cn    Cq   Ci Case 2B: reads: er/c
C0    C1    C2   C3    C4    C5    C6    C7         C0
Er    An    Aq   Ai    Bn    Bq    Bi    Cn         Ci Case 2C: reads: er/c
C0    C1    C2   C3    C4          C5    C6    C7   C0
Er    An    Aq   Ai    Bn          Bi    Cn    Cq   Ci
```

Fig. 15B

```
Case 2A re-use: #redundancies/reads=0, #qpw states=2
C0    XX         C2    C3    C4    C5    C6    C7   C1
Er    An         Ai    Bn    Bq    Bi    Cn    Cq   Ci
```

Fig. 15C

```
Case 3: #redundancies/reads=2, #qpw states=3, reads: er/b, b/c
C0    C1    C2   C3    C4    C5    C0    C6    C7   C0
Er    An    Aq   Ai    Bn    Bq    Bi    Cn    Cq   Ci
```

```
Case 4: #redundancies/reads=0, #qpw states=1
C0   C1   C2   C3   C4   C5   C6   C7   C8   C9   C10  C11  C12  C13  C14  C15
Er   An   Ai   Bn   Bi   Cn   Cq   Ci   Dn   Di   En   Ei   Fn   Fi   Gn   Gi Case 5: #redundancies/reads=1, #qpw states=2, reads: er/g
C0   C1   C2   C3   C4   C5   C6   C7   C8   C9   C10  C11  C12  C13  C14  C15
Er   An   Ai   Bn   Bi   Cn   Cq   Ci   Dn   Dq   Di   En   Ei   Fn   Fi   Gn   Gi Case 6: #redundancies/reads=2, #qpw states=3, reads: er/c, c/g
C0   C1   C2   C3   C4   C5   C6   C7   C8   C9   C10  C11  C12  C13  C14  C15
Er   An   Ai   Bn   Bi   Cn   Cq   C0   Dn   Dq   Di   En   Ei   Fn   Fi   Gn   Gi Case 7: #redundancies/reads=3, #qpw states=4, reads: er/b, b/d, d/g
C0   C1   C2   C3   C0   C4   C5   C6   C7   C8   C0   C9   C10  C11  C12  C13  C14  C15
Er   An   Ai   Bn   Bi   Cn   Cq   Ci   Dn   Dq   Di   En   Eq   Ei   Fn   Fi   Gn   Gi Case 8: #redundancies/reads=4, #qpw states=5, reads: er/b, b/d, d/e, e/g
C0   C1   C2   C3   C4   C0   C5   C6   C7   C8   C9   C0   C10  C11  C12  C13  C14  C15
Er   An   Ai   Bn   Bq   Bi   Cn   Cq   Ci   Dn   Di   En   Eq   Ei   Fn   Fi   Gn   Gi Case 9: #redundancies/reads=5 #qpw states=6, reads: er/a, a/b, b/d, d/e, e/g
C0   C1   C2   C0   C3   C4   C0   C5   C6   C7   C8   C9   C0   C10  C11  C12  C13  C14  C15
Er   An   Aq   Ai   Bn   Bq   Bi   Cn   Cq   Ci   Dn   Di   En   Eq   Ei   Fn   Fi   Gn   Gi Case 10: #redundancies/reads=6 #qpw states=7, reads: er/a, a/b, b/d, d/e, e/f, f/g
C0   C1   C2   C0   C3   C4   C0   C5   C6   C7   C8   C9   C0   C10  C11  C12  C13  C0   C14  C15  C0
Er   An   Aq   Ai   Bn   Bq   Bi   Cn   Cq   Ci   Dn   Di   En   Eq   Ei   Fn   Fq   Fi   Gn   Gq   Gi
```

DEFECT OR PROGRAM DISTURB DETECTION WITH FULL DATA RECOVERY CAPABILITY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Techniques are need for accurately programming a memory device, in particular, when defects are present.

BRIEF DESCRIPTION OF THE DRAWINGS

FIG. 3 is a block diagram depicting one embodiment of the sense block SB0 of FIG. 1.

FIGS. 5A to 5C depict a two pass programming operation with only the normal programming mode used on the first pass, normal and slow programming modes used on the second pass and four data states.

FIG. 9A depicts an example arrangement of bit combinations in data latches, where there are four data states, two bit combinations are unused, two data states have a quick pass write mode (Aq and Bq), and all of the data states have a same bit combination (C0) for an inhibit mode, in a comparative example.

FIG. 9B depicts an example arrangement of bit combinations in data latches, where there are four data states, one bit combination is unused, two data states have a quick pass write mode (Aq and Bq), the Er and A data states have a same bit combination for an inhibit mode, and the B and C data states have a same bit combination for an inhibit mode, in a lower page preserve mode.

FIG. 10A depicts an example arrangement of bit combinations in data latches, where there are four data states, no bit combinations are unused, one data state has a quick pass write mode (Bq), and all of the data states have a different bit combination for an inhibit mode, in a program mode A.

FIG. 10B depicts an example arrangement of bit combinations in data latches, where there are four data states, no bit combinations are unused, two data states have a quick pass write mode (Aq and Bq), the Er and C data states have a same bit combination for an inhibit mode, and the A and B data states have different bit combinations, in a program mode B.

FIG. 11 depicts bit combinations in data latches in an example data reconstruction process in accordance with the program mode A of FIG. 10A, for program status=pass.

FIG. 12A-12E depict bit combinations in data latches in an example data reconstruction process in accordance with the program mode B of FIG. 10B, for program status=pass.

FIG. 13A-13H depict bit combinations in data latches in an example data reconstruction process in accordance with the program mode A of FIG. 10A, for program status=fail.

FIG. 14A-14F depict bit combinations in data latches in an example data reconstruction process in accordance with the program mode B of FIG. 10B, for program status=fail.

FIG. 15A depicts example assignments of bit combinations to data latches for a case with four data states, zero redundant bit combinations, zero reads for reconstruction and one state with a quick pass write mode.

FIG. 15B depicts example assignments of bit combinations to data latches for a case with four data states, one redundant bit combination, one read for reconstruction and two states with a quick pass write mode.

FIG. 15C depicts a re-use of the bit combination C1 from the normal program mode An of the A state in FIG. 15B, case 2A, to the inhibit mode Ci of the C state, to provide a case with no redundant bit combinations, no reads for reconstruction and two states with a quick pass write mode.

FIG. 15D depicts an example assignment of bit combinations to data latches for a case with four data states, two redundant bit combinations, two reads for reconstruction and three states with a quick pass write mode.

FIG. 16 depicts example assignments of bit combinations to data latches for various cases with eight data states.

DETAILED DESCRIPTION

Figure 1:
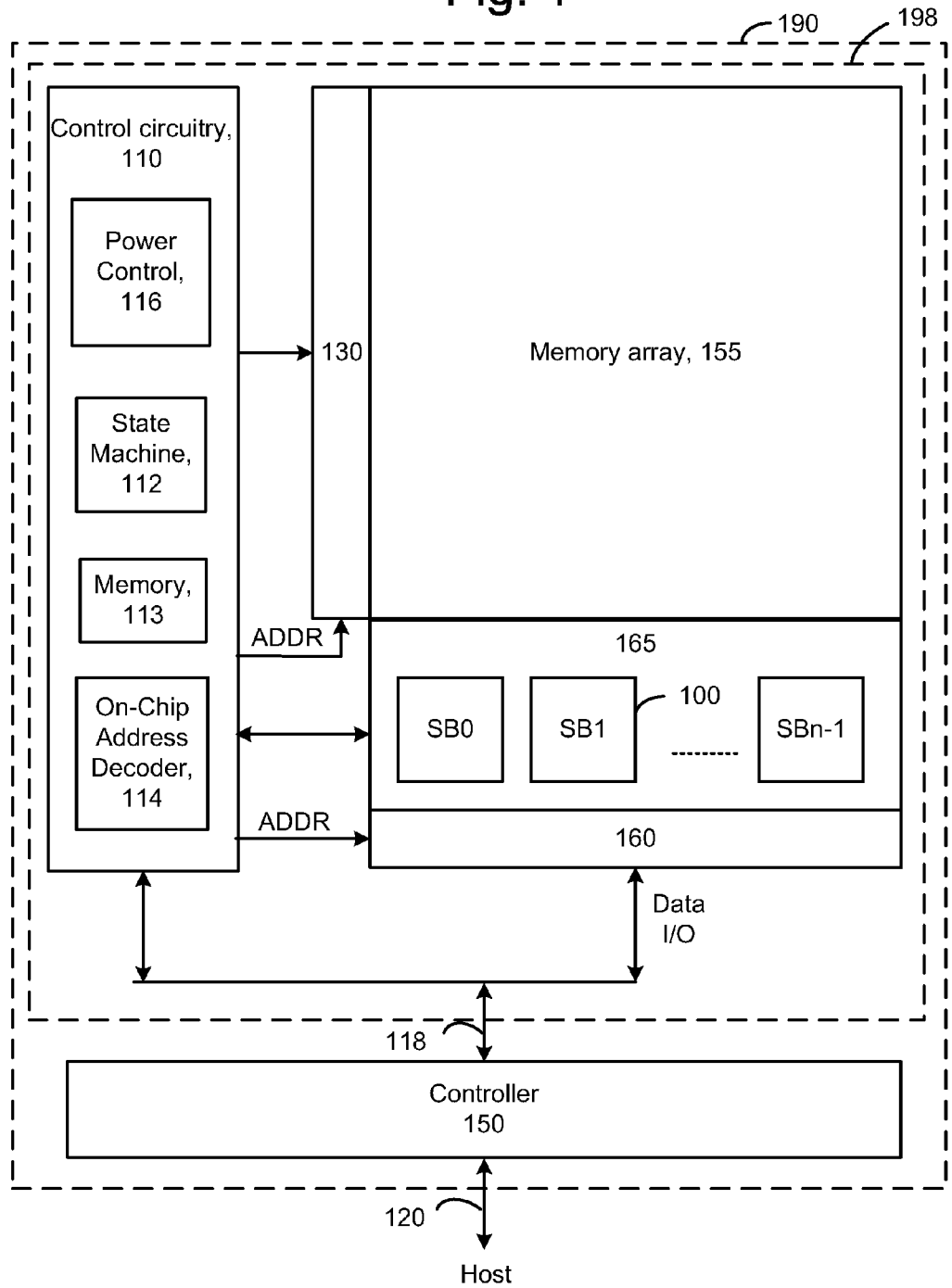
FIG. 1 is a block diagram of a non-volatile memory system using single row/column decoders and read/write circuits.

A method and non-volatile storage system are provided for accurate programming, in particular, when defects are present.

During a programming operation, when write data is programmed on a given word line, the program status may indicate that the programming has been successfully completed, while a subsequent read of the data indicates a failure. Various kinds of defects can cause such a behavior (program pass and read fail). One example is a broken word line. This can be a word line which has slight cracks which cause the affected area to behave as a resistive/capacitive connection. Weak word line-to-word line shorts also cause similar behavior. FIG. 4C, discussed further below, show the effects of a broken word line. When a defect is present, threshold voltage (Vth) distributions 403, 405 and 407 for data states A, B and C are lower than the corresponding distributions 404, 406 and 408, respectively, when no defect is present. In particular, a broken word-line can have a high resistive connection across the break, so that memory cells on a far end of the word line (on the other side of the break from the word line driver) see a voltage drop during both program and verify operations. This leads to programming pulses having a lower amplitude, so that cells will be programmed less; but as the verify level is also lowered, these under-programmed cells may still pass verify. When the memory cells are later read back, an error can result. In some cases, the read operation may allow a longer time for word line and bit line settling so that the read operation is more accurate than the verify operation. That is, even if the broken/lose end of the word line does not receive the correct bias initially during the verify operation, due to the resistive/capacitive effects of the defect, the word line bias eventually settles down to the correct bias or close to the correct bias.

Such failures lead to a read failure at the user level. A solution to recover the data during such failures would be useful. In one approach, once a memory cell reaches its target data state, its corresponding data latches are all flipped to '1' so that it is not possible to distinguish an erased cell from other data states that have completed programming and been locked out. In this case, even if a read operation is done after programming, there is no way to compare the read data against the actual expected data.

In another approach, a read operation uses a read level at the upper end of one data state's Vth distribution and another read level at the lower end of the next higher data states' Vth distribution to count the number of cells whose Vth is in a zone between the read levels. If the count exceeds a certain threshold, a fail status is issued. However, this approach also does not allow recovery of the data. For example, the reads can be between the Vth distributions of the erased (Er) and A states, the A and B states or the B and C states. See FIG. 4C, depicting a read level 409 (Vr_eu) at the upper end of the Er state and read level 410 (Vr_al) at the lower end of the A state; read level 411 (Vr_au) at the upper end of the A state and read level 412 (Vr_bl) at the lower end of the B state; and a read level 413 (Vr_bu) at the upper end of the B state and read level 414 (Vr_cl) at the lower end of the C state. These read levels can be predetermined before the programming operation.

To address these challenges, programming techniques are provided in which unused data latch combinations are assigned to locked out cells belonging to different data states. As a result, there is a way to distinguish between cells from different states after programming is completed. After the programming is completed, e.g., with a program status=pass, the programmed data is read (e.g., both lower and upper pages) and the read data is compared against the data in the data latches. If the number of mismatches is above a certain threshold level, a read status=fail is issued and data recovery is performed.

An example memory system which can be used is discussed next. Generally, any type of non-volatile memory can be used. A memory with NAND strings is an example only. FIG. 1 is a block diagram of a non-volatile memory system using single row/column decoders and read/write circuits. The diagram illustrates a memory device 190 having read/write circuits for reading and programming a page of storage elements in parallel, according to one embodiment. Memory device 190 may include one or more memory die 198. Memory die 198 includes a two-dimensional memory array 155 of storage elements, control circuitry 110, and read/write circuits 165.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 and managing circuit MC0 in FIG. 3), read/write circuits 165, and controller 150, and so forth. The sense block 100 is discussed further in connection with FIG. 3.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
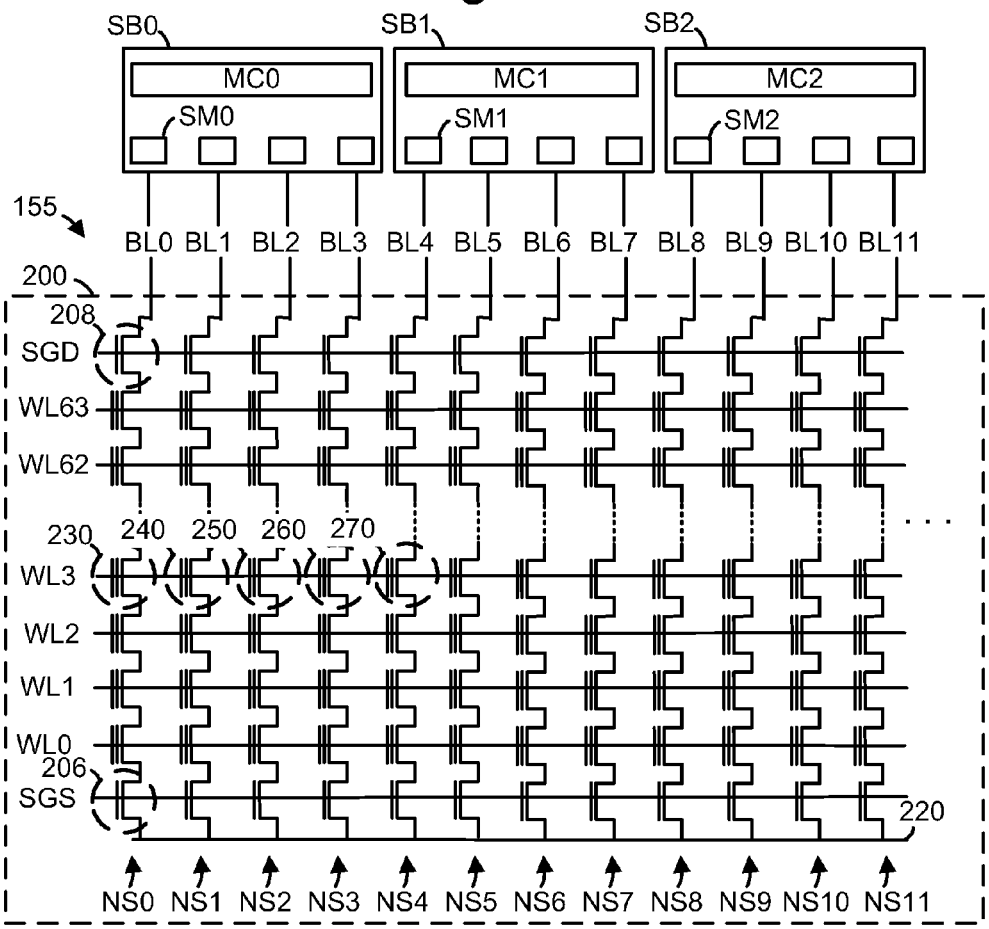
FIG. 2A depicts a block of NAND flash memory cells in the memory array 155 of FIG. 1 and associated sense blocks SB0, SB1 and SB2.

FIG. 2A depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 220. For example, NS0 includes a source side select gate transistor 206 and a drain side select gate transistor 208. Example storage elements 230, 240, 250, 260 and 270 are in NS0 to NS4, respectively, and are connected to WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
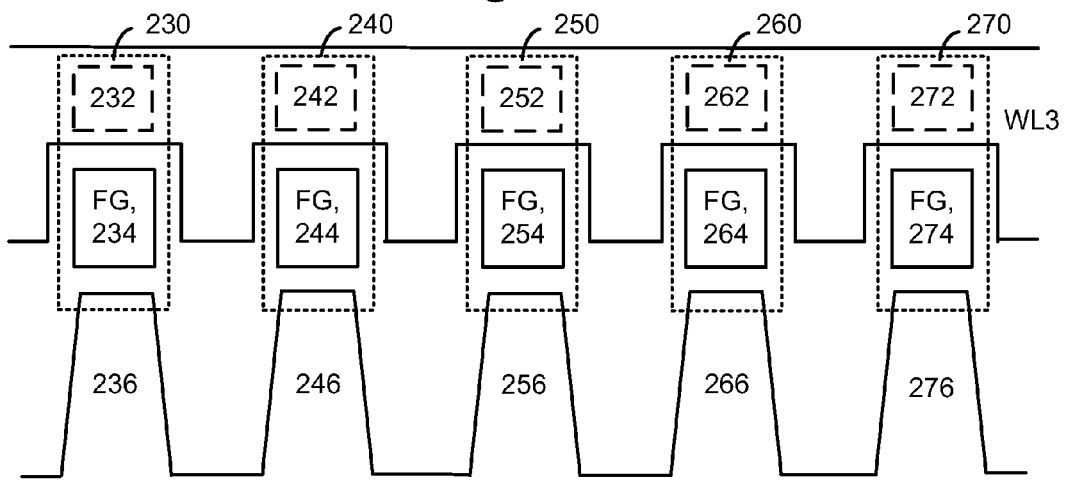
FIG. 2B depicts a cross-sectional view of the NAND strings of FIG. 2A.

FIG. 2B depicts a cross-sectional view of the NAND strings of FIG. 2A. A bit line or NAND string direction goes into the page, and a word line direction goes from left to right.

As an example, WL3 extends across NAND strings NS0 to NS4 which include respective channel regions 236, 246, 256, 266 and 276. The storage element 230 in NS0 includes a control gate 232, a floating gate 234 and the channel region 236. The storage element 240 in NS1 includes a control gate 242, a floating gate 244 and the channel region 246. The storage element 250 in NS2 includes a control gate 252, a floating gate 254 and the channel region 256. The storage element 260 in NS3 includes a control gate 262, a floating gate 264 and the channel region 266. The storage element 270 in NS4 includes a control gate 272, a floating gate 274 and the channel region 276.

FIG. 3 is a block diagram depicting one embodiment of the sense block SB0 of FIG. 1. The sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of storage elements.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches 194-197 and an I/O Interface 196 coupled between the set of data latches 194 and data bus 120. One set of data latches can be provide for each sense module, and data latches identified by SDL, LP (XDL), UP (LDL) and QPW (UDL) may be provided for each set. LP stores a bit for a lower page of write data, and UP stores a bit for an upper page of write data. This is in a four-level or two-bits per storage element memory device. QPW stores a bit indicating whether a quick pass write mode, discussed further below, is active. SDL stores a bit from a read of a memory cell. During a read operation, the SDL latch first receives the bit and optionally can transfer the bit to the other data latches. Moreover, in one approach, LP is the only data latch the control circuitry can access so that the LP, QPW and UP data are toggled out from the LP latch during a read.

Optionally, additional data latches could be used as well. For example, in a three-bit per storage element implementation, one extra data latch MP may be used to store the middle page data. A four-bit per storage element implementation can use lower-middle and upper-middle data latches. Further, more than one QPW latch could be used to designate more than one QPW mode. The techniques provided herein are meant to encompass such variations.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed storage element. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed storage elements. Each program pulse is followed by a read back (verify) to determine if the storage element has been programmed to the desired memory state. See FIG. 8B. In some cases, processor 192 monitors the read back memory state relative to the desired memory state. When the two states agree, the processor 192 sets the bit line latch 182 to cause the bit line to be pulled to a state designating program inhibit. This inhibits the storage element coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operation. For example, data latches may identify that the Vth of a storage element is below a particular verify level. The data latches indicate whether a storage element currently stores one or more bits from a page of data. For example, an LP data latch is flipped (e.g., from 0 to 1) when a lower page bit is stored in an associated storage element. An UP data latch is flipped when an upper page bit is stored in an associated storage element. The flipping of a bit occurs when an associated storage element completes programming, e.g., when its Vth exceeds a target verify level such as VvaH, VvbH or VvcH. When lower, middle and upper page bits are used (e.g., in case of three-bit per storage element memory), the MP data latch is also flipped when a middle page bit is stored in an associated storage element. For example, in FIG. 6B to 6E, the first bit (from right to left) is the lower page bit, the second bit is the middle page bit and the third bit is the upper page bit. Additional information regarding the setting of data latches is provided below.

Figure 4A:
FIGS. 4A and 4B depict a one pass programming operation with normal and slow programming modes and four data states.
Figure 4B:
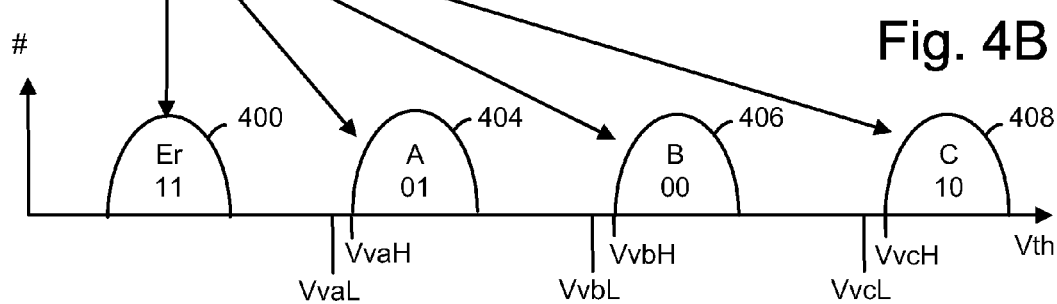
Figure 4C:
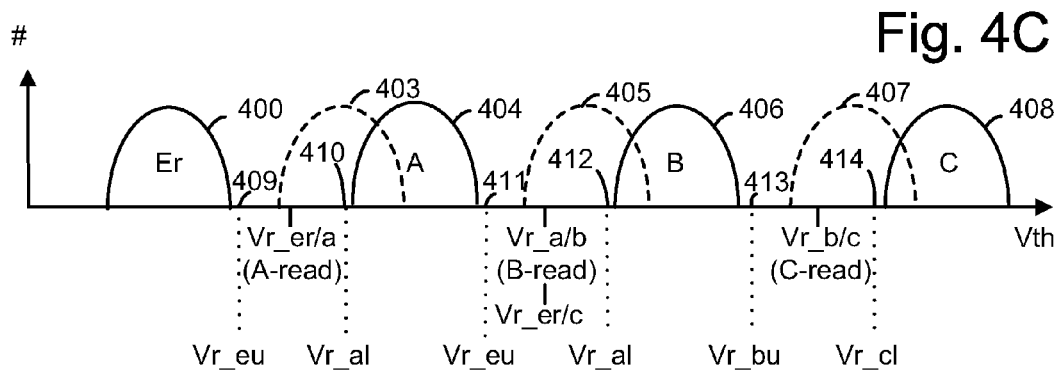
FIG. 4C depicts read levels for normal reading and for data reconstruction for the four data states of FIG. 4B.

FIGS. 4A and 4B depict a one pass programming operation with normal (e.g., fast) and slow programming modes and four data states. One pass programming is also referred to as "one-pass write" programming which involves a sequence of multiple program-verify operations which are performed starting from an initial Vpg level and proceeding to a final Vpg level until the threshold voltages of a set of selected storage elements reach one or more respective verify levels of respective target data states. In one pass programming, all storage elements are initially in an erased state. Some of the storage elements are not programmed and remain in the erased state while others are programmed to higher target data states.

Example Vth distributions for the storage element array are provided for a case where each storage element stores two bits of data. Each graph depicts Vth on the horizontal axis and a number or population of storage elements in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state storage elements. Three Vth distributions 404, 406 and 408 represent target data states A, B and C, respectively, which are reached by storage elements when their Vth exceeds a higher verify level VvaH, VvbH or VvcH, respectively. In this case, each storage element can store two bits of data in one of four possible Vth ranges, referred to as states Er, A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvaL, VvbL or VvcL) are defined such that the storage elements enter a slow programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a storage element exceeds the lower verify level associated with the target data state of the storage element, a slow programming mode begins for the storage element. Subsequently, when a verify test determines that the Vth of a storage element exceeds the higher verify level associated with the target data state of the storage element, the storage element is inhibited from further programming.

In some cases, QPW is used on fewer than all target data states. For example, a wider Vth distribution may be acceptable for the highest data state (e.g., the C state in this example). Total programming time may be reduced by avoiding the use of QPW with the highest data state, since the time spent in sensing whether the Vth exceeds VvcL can be avoided. Generally, QPW can be used for selected target data states based on testing which identifies the target data states for which QPW yields the most benefit. Moreover, as discussed further below, the assignment of bit combinations to the data latches can be based on the data states which use the QPW mode.

The specific relationship between the data programmed into a storage element and the Vth level of the storage element depends upon the data encoding scheme adopted for the storage elements. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B and C state. Read reference voltages which are between the distributions are used for reading data from the storage elements. By testing whether the Vth of a given storage element is above or below one or more of the read reference voltages, the system can determine the data state which is represented by a storage element.

FIG. 4C depicts read levels for normal reading and for data reconstruction for the four data states of FIG. 4B. A normal read level (i.e., a read level which is not for data recovery) can be used, e.g., to distinguish between adjacent data states. For example, Vr_er/a (which represents an A-read or A state read) distinguishes between the Er and A states, Vr_a/b (which represents a B-read or B state read) distinguishes between the A and B states, and Vr_b/c (which represents a C-read or C state read) distinguishes between the B and C states. Read levels can be defined for data reconstruction which occurs in connection with a programming operation. A read level for data reconstruction can be the same as or different than a normal read level (i.e., a read level which is not for data reconstruction). In some cases, a read level for data reconstruction can be a rough read which distinguishes non-adjacent data states. A read level for data reconstruction can be set to be about midway between the Vth distributions which are being distinguished. For example, to distinguish the Er and C states, the read level of Vr_er/c is used, which can be the same as Vr_a/b. Vr_er/c is about midway between the distributions 400 and 408. Advantageously, there is a sufficient margin below and above this read level to distinguish between the Vth distribution 400 of the Er state and the Vth distribution 407 of the C state for a defect word line. Thus, the different data states involved in the reconstruction read (e.g., Er and C) are separated from one another by at least one other data state (e.g., A, B) of a plurality of data states. This is also an example of the different data states being furthest from one another among the plurality of data states.

FIGS. 5A to 5C depict a two pass programming operation with only the normal programming mode used on the first pass, normal and slow programming modes used on the second pass and four data states. Each pass can be used to program a page of data. For example, programming of lower and upper pages in two-bit, four-level storage elements is provided. Programming can be performed one logical page at a time, with the lower page followed by the upper page. Initially, all storage elements are in the Er state, represented by the distribution 500 in FIG. 5A.

FIG. 5B depicts programming of a lower page of data. If the lower page has a bit=1, the associated storage element remains in the distribution 500 and the data is represented by x1, where x is an upper page bit that is not yet known. If the lower page has a bit=0, the storage element is programmed to a higher Vth as represented by distribution 502, which is an interim distribution (INT), using a verify level Vv1. The data of these storage elements is represented by x0. Note that the interim distribution can be relatively wide since it is not a final distribution and does not represent a final data state.

FIG. 5C depicts programming of an upper page of data. If UP/LP=11, the associated storage element in the distribution 500 remains in the distribution 500 and stores data bits 11. If UP/LP=01, the storage elements in the distribution 500 are programmed to the distribution 504 (state A) and a slow programming mode is used when the Vth is between VvaL VvaH. If UP/LP=10, the storage elements in the distribution 502 are programmed to the distribution 508 (state C) and a slow programming mode is used when the Vth is between VvcL and VvcH. If UP/LP=00, the storage elements in the distribution 502 are programmed to the distribution 506 (state B) and a slow programming mode is used when the Vth is between VvbL and VvbH.

Programming can be similarly extended to three or more bits per storage element. For example, FIGS. 6A to 6D depict a three pass programming operation with normal and slow programming modes used on the third pass, and eight data states. Programming of lower, middle and upper pages in three-bit, eight-level storage elements is depicted. Seven programmed data states A through G are used in addition to Er for eight states total. Initially, all storage elements are in the Er state, represented by the distribution 600. The lower page is programmed in FIG. 6B. If LP=1, storage elements in distribution 600 remain in that distribution. If LP=0, storage elements in distribution 600 are programmed to an interim distribution 602 using Vv1. The middle page is programmed in FIG. 6C. If MP=1, storage elements in distribution 600 remain in that distribution, and storage elements in distribution 602 are programmed to interim distribution 608 using verify level Vv4. If MP=0, storage elements in distribution 600 are programmed to interim distribution 604 using verify level Vv2, and storage elements in distribution 602 are programmed to interim distribution 606 using verify level Vv3.

Figure 6A:
FIGS. 6A to 6D depict a three pass programming operation with normal and slow programming modes used on the third pass, and eight data states.
Figure 6B:
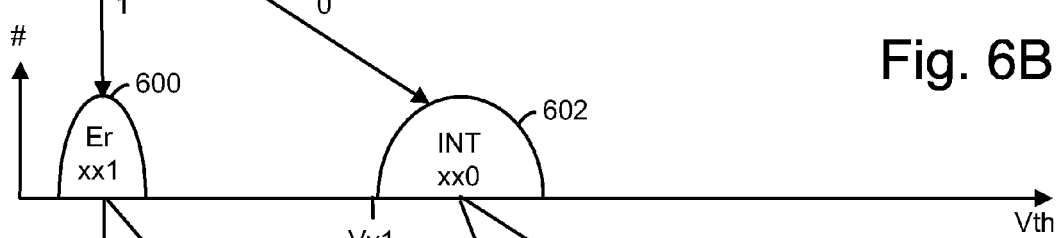
Figure 6C:
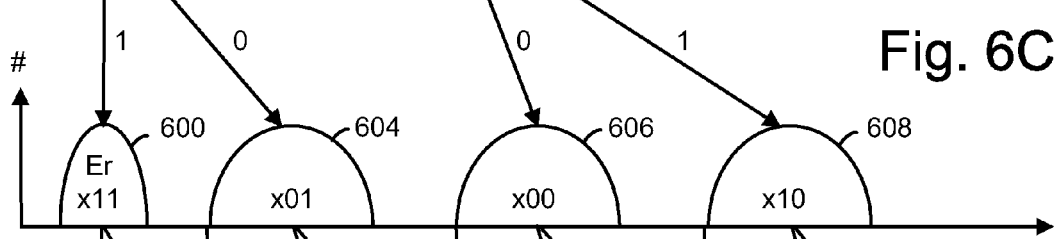
Figure 6D:
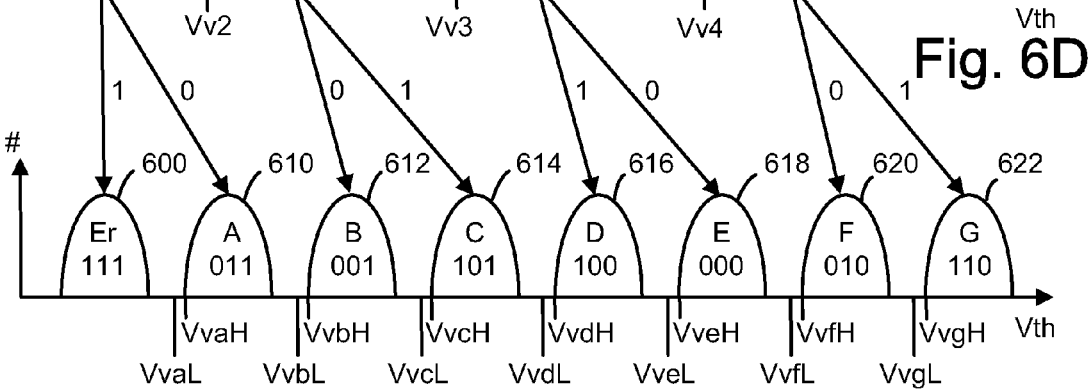

The upper page is programmed in FIG. 6D. QPW is used for this pass. If UP=1, storage elements in distribution 600 remain in that distribution, storage elements in distribution 604 are programmed to distribution 614 (state C), storage elements in distribution 606 are programmed to distribution 616 (state D), and storage elements in distribution 608 are programmed to distribution 622 (state G). If UP=0, storage elements in distribution 600 are programmed to distribution 610 (state A), storage elements in distribution 604 are programmed to distribution 612 (state B), storage elements in distribution 606 are programmed to distribution 618 (state E), and storage elements in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

Figure 6E:
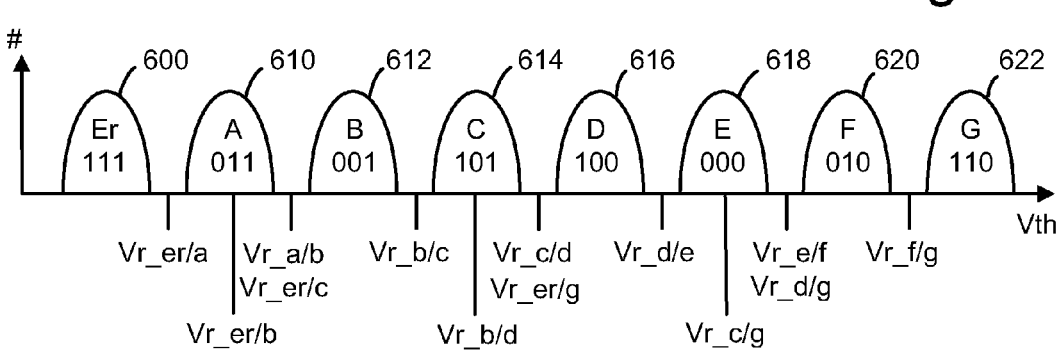
FIG. 6E depicts read levels for normal reading and for data reconstruction for the eight data states of FIG. 6D.

FIG. 6E depicts read levels for normal reading and for data reconstruction for the eight data states of FIG. 6D. As mentioned in connection with FIG. 4C, read levels for data recovery can be defined based on the midpoint between the Vth distributions of two data states which are to be distinguished. Moreover, normal read levels can be defined as well. In this example, the normal reads levels are: Vr_er/a, Vr_a/b, Vr_b/c, Vr_c/d, Vr_d/e, Vr_e/f and Vr_f/g to distinguish between Er and A, A and B, B and C, C and D, D and E, E and F and F and G states, respectively. Example read levels are for reconstruction are: Vr_er/b, Vr_er/c, Vr_b/d, Vr_er/g, Vr_c/g and Vr_d/g to distinguish between Er and B, Er and C, B and D, Er and G, C and G and D and G states, respectively.

Figure 7A:
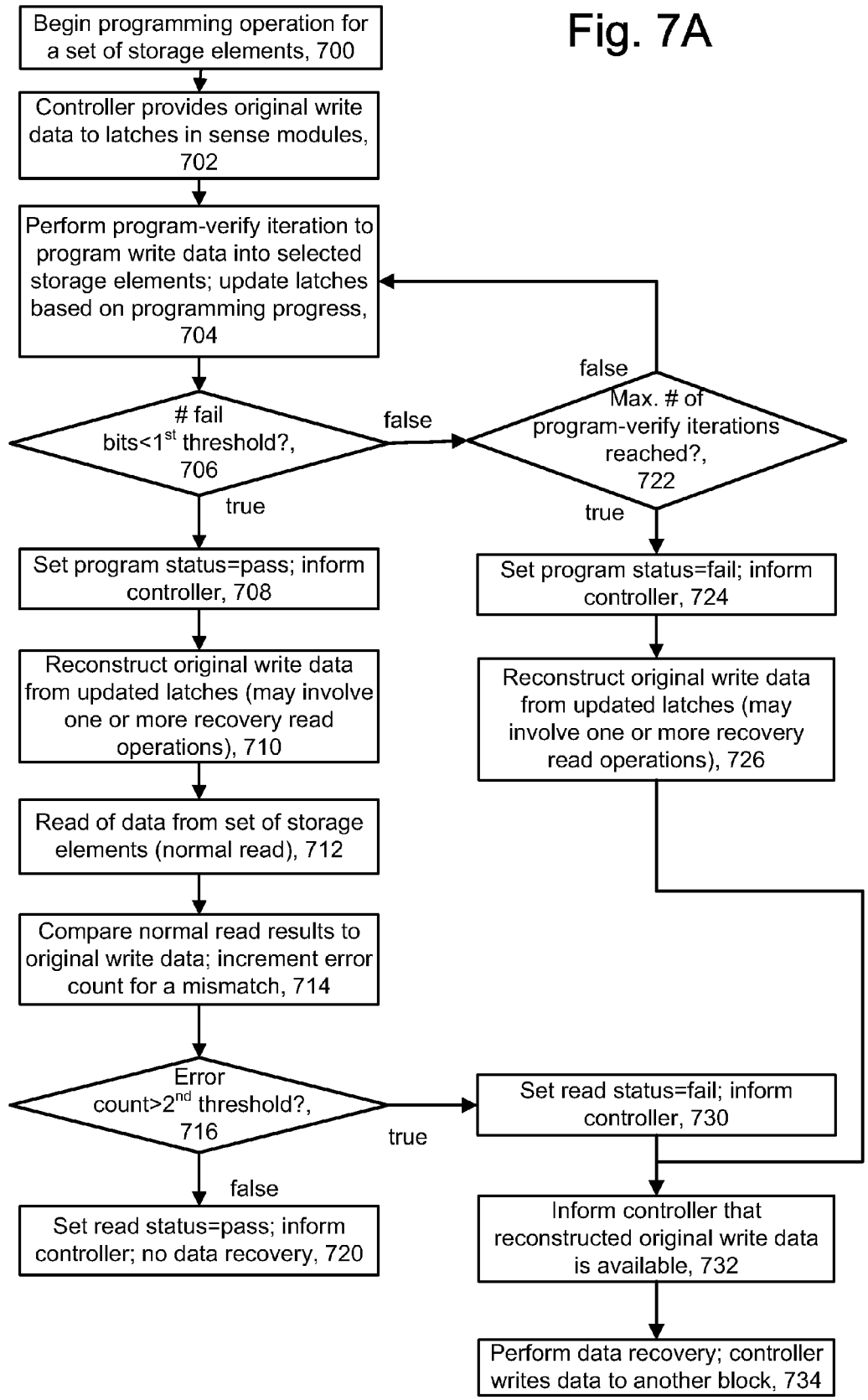
FIG. 7A depicts a programming operation in which data reconstruction and recovery are used.

FIG. 7A depicts a programming operation in which data reconstruction and recovery are used. Data reconstruction is used to determine whether data recovery (re-writing data) is required. Since this technique requires read operations which have some time penalty, the mode may be enabled/disabled on different occasions. For example, typically most failures are expected to show up in early cycles (first ~100 write-erase cycles). Thus, in one approach, the mode can be enabled for early cycles and disabled later to avoid a performance penalty.

Figure 17:
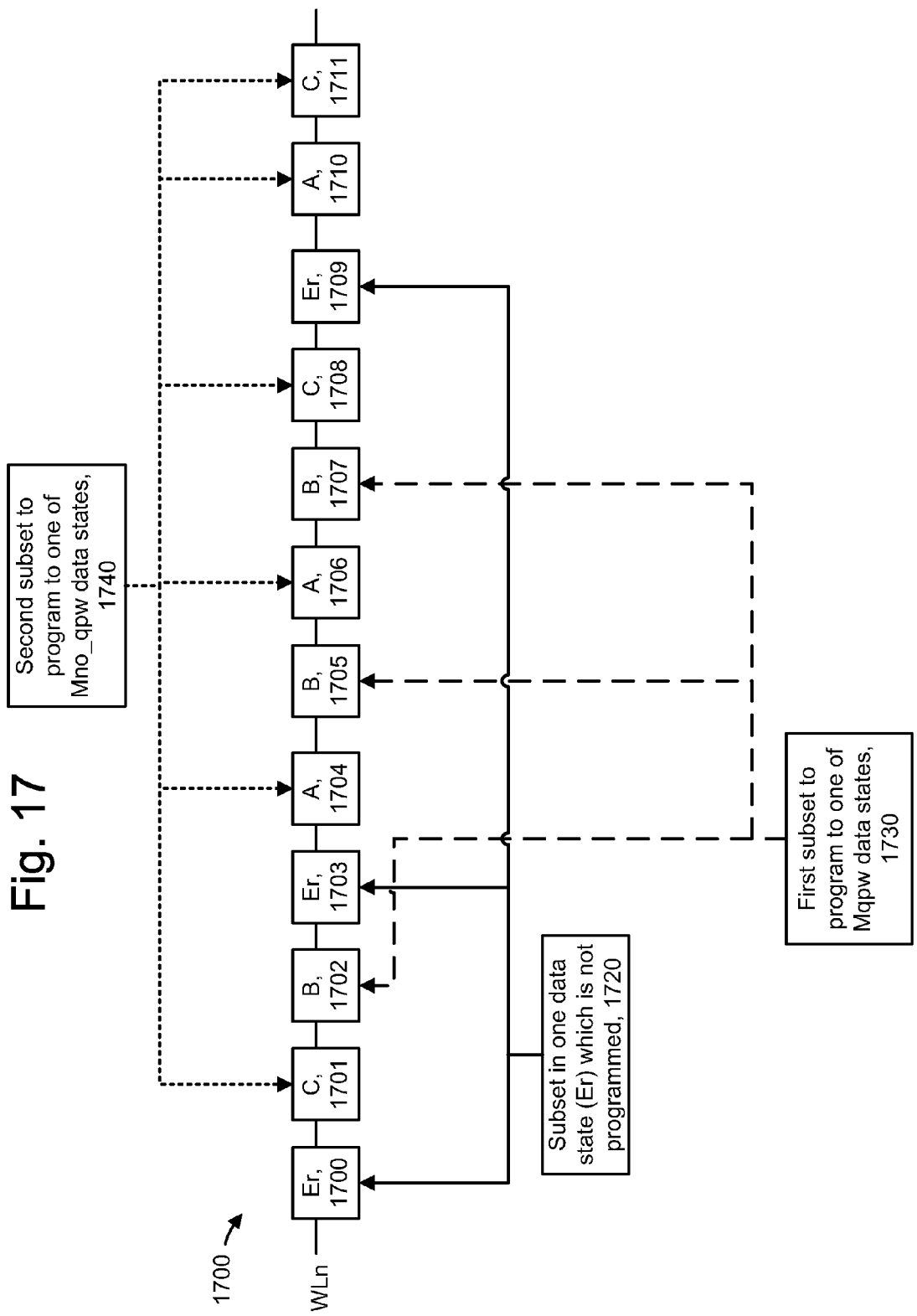
FIG. 17 depicts example subsets of storage elements which are programmed along a word line WLn.

A programming operation for a plurality or set of storage elements begins at step 700. This could be a pass in a multi-pass programming process, for instance. At step 702, the controller provides original write data to the data latches in the sense modules. Step 704 performs a program-verify iteration to program the write data into selected storage elements; and to update data latches based on the programming progress, as discussed further in connection with FIG. 7B. The set of storage elements includes selected and unselected storage elements. A selected storage element can be a storage element which is has been identified at the start of the programming operation as a storage element which is to be programmed to a target data state. An unselected storage element can be a storage element which has not been identified at the start of the programming operation as a storage element to be programmed to a target data state. For example, this could be an Er state storage element. The Er state is one data state of a plurality of data states. As depicted in FIG. 17, the selected storage elements can include a first subset of a plurality of non-volatile storage elements which are to be programmed to one of Mqpw data states of the plurality of data states using a normal programming mode and then a slow (QPW) programming mode, and a second subset of the plurality of non-volatile storage elements which are to be programmed to one of Mno_qpw data states of the plurality of data states using the normal programming mode but not the slow programming mode. Mqpw and Mno_qpw are integers, Mqpw≥1 and Mno_qpw≥1.

Decision step 706 determines if a number (#) of fail bits (e.g., selected storage elements which have not yet pass a verify test) is less than a first threshold, such as an acceptable number of fail bits in the programming operation. That is, decision step 706 determines if a sufficient number of cells have passed a verify test to conclude that the programming is completed. If decision step 706 is true, step 708 is reached. In this case, most of the selected storage elements have passed the verify test. If decision step 706 is false, decision step 722 determines whether a maximum allowable number of program-verify iterations have been reached. If decision step 722 is false, an additional program-verify iteration is performed at step 704.

At step 708, a program status is set to pass, indicating that the program operation has successfully completed. The program status can be a flag which is set by the memory chip, e.g., by the state machine. The program status, along with a read status can be interpreted by an external controller 150. The memory chip can optionally inform the controller of the program status. For example, the program status can be signaled back to the controller using ready/busy status indications. It could be useful at a system level for the controller to know that the programming is done and that the reconstruction process is going to be performed. In response to the program status, the controller could, e.g., take control of the reconstruction process or abort it early. Or, the controller could use the program status as an indication that the programming process is almost complete and to prepare for a next operation.

Step 710 reconstructs the original write data from the updated data latches and this may involve one or more reconstruction read operations. See also FIG. 7C. Thus, for each storage element, the data in the associated data latches in combination with the one or more reconstruction read operations determines a data state of the storage element. This reconstructed data state is associated with a bit combination of original write data as described in FIGS. 4A-6E and further below. This data state is associated with a bit combination of original write data as described in FIGS. 4A-6E and further below. This read operation can be for a selected word line (WLn). The read can be at single read level or full lower page and upper page read. Step 712 reads data from the set of storage elements using a normal read which does not rely on the associated data latches to determine a data state of each storage element. Step 714 compares the normal read results to the original write data as reconstructed and preserved in the data latches, and increments an error count if there is a mismatch. Each mismatch represents one of the non-volatile storage elements for which a data state indicated by the read data is different than the data state indicated by the set of data latches.

This can involve comparing LP and UP read data with the with the "full-data preserve" bits in the data latches. In one approach, this is done by the state machine. Decision step 716 determines if the error count exceeds a second threshold, e.g., representing an unacceptable number of errors. If decision step 716 is false, step 720 sets a read status=pass and informs the controller. In this case, no data recovery (re-write) is performed. The method thus includes informing the controller that the write data has been successfully written to the plurality of non-volatile storage elements when the number of the mismatches does not exceed a second threshold number.

In one approach, the second threshold number is set based on the number of the non-volatile storage elements which have not completed programming, such that a sum of the second threshold number and the number of the non-volatile storage elements which have not completed programming is kept under a maximum error-correctable number of fail bits.

If decision step 716 is true, step 730 sets the read status=fail and informs the controller. The method thus includes informing the controller that re-writing of the write data is required when the number of the mismatches exceeds a second threshold number. In step 732, the memory chip informs the controller that the reconstructed original write data is available. At step 732, data recovery is performed such as by the controller writing the data to another block. In one approach, the reconstructed original write data is output to the controller and the controller inputs the write data back into memory chip with a command to write to a different address such as a different block. In another approach, the controller provides a new address to the memory chip to write the data.

If decision step 722 is true, step 724 is reached. This sets the program status=fail and informs the controller. Step 726, analogous to step 710, reconstructs the original write data from the updated data latches and this may involve one or more reconstruction read operations. Subsequently, steps 732 and 734 are reached. Thus, the original write data can be reconstructed to allow the data to be re-written. Advantageously, even if program status=pass, a defect in a word line is detected so that the word line is not used to store data. As a result, a subsequent error in reading back the data from the defective word line is avoided. The defective word line can be flagged so that it is no longer used.

Thus, there are two major cases under which data recovery is initiated. First, in case of a program status failure or, second, in case the read operation performed after the program pass status is reached indicates errors>certain threshold error count. Note that this read operation can be a single read (such as A-read done to check for E->A fails caused by program disturb) or a complete LP/UP read, or something in between those two cases. The process for determining the mismatch count and data recovery (if needed) depends on whether the program mode used was mode-A or mode-B. In case of mode-A, full LP/UP data is preserved in the data latches (see FIG. 11). In the case of mode-B, a B-read operation is used to reconstruct the full LP/UP data (see FIG. 12). Further, in the case where a data recovery is initiated after program status passes but the mismatch read errors are judged above certain threshold count, all or most of the cells have locked out. Thus, during the data recovery, only the data from data latches for the locked out (inhibited) cells and the B-read operation (needed for mode-B case) are combined. For example, FIGS. 11 and 12A-12E can be followed. However, under the program status=fail case, FIGS. 13A-13H or FIGS. 14A-14F can be followed as an example. This is a difference in the data recovery sequence between program status fail and pass case.

Figure 7B:
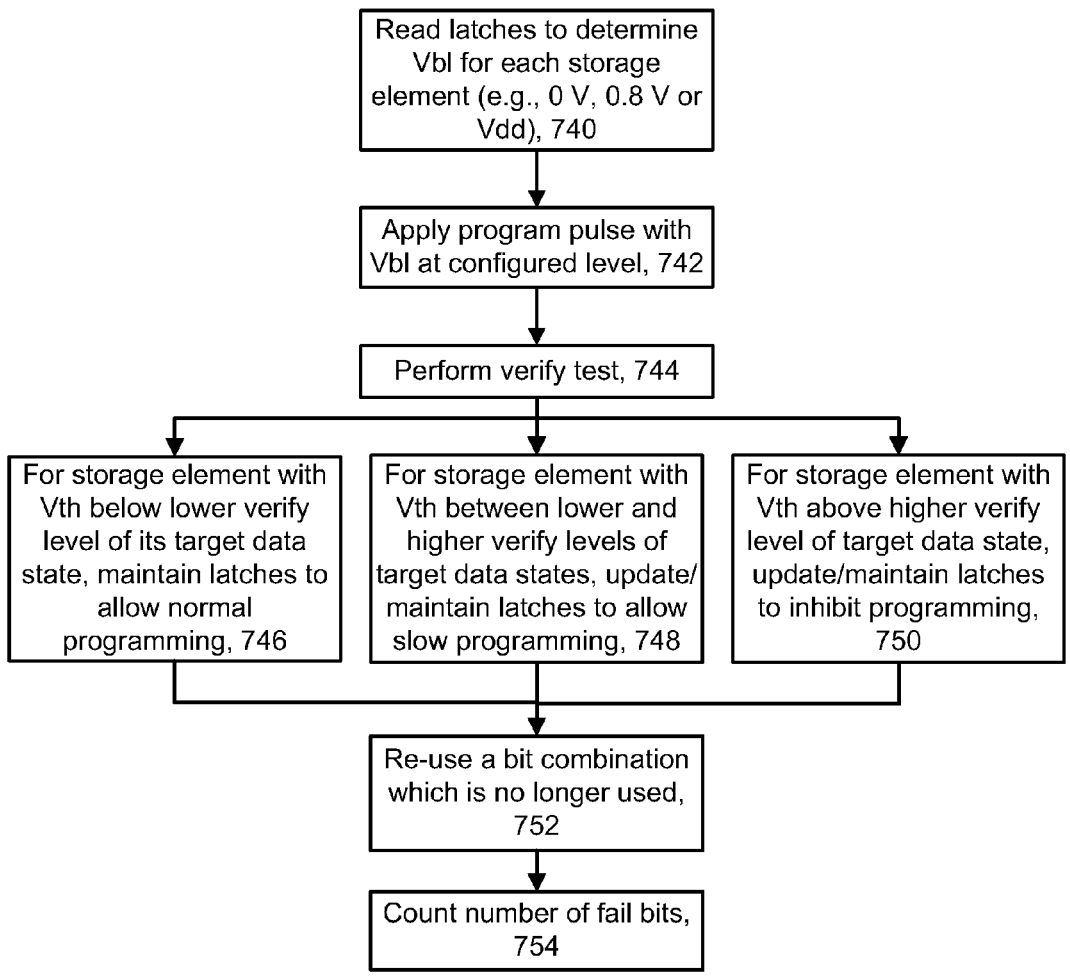
FIG. 7B provides example details of step 704 of FIG. 7A.

FIG. 7B provides example details of step 704 of FIG. 7A. In a program-verify iteration, the data latches are read at step 740 to determine a bit line voltage (Vbl) for each storage element (e.g., 0 V for normal programming, 0.8 V for slow programming or Vdd for inhibit/lockout). At step 742, a program pulse is applied to a selected word line with Vbl at the configured level for each storage element along the selected word line. At step 744, a verify test is performed for each selected storage element, e.g., using lower and higher verify levels associated with the different target data states. In one possible approach, the sensing to determine whether the Vth of a memory cell exceeds the lower verify voltage of its target data state involves applying the lower verify voltage to the control gate of the memory cell via a word line and determining, after a specified sense time, whether a current through the memory cell and associated NAND string is greater than a reference current. The sense time and reference current can be the same when determining whether the Vth of a memory cell exceeds the higher verify voltage of its target data state. In this case, the higher verify voltage is applied to the control gate of the memory cell via the word line.

In another approach, the same control gate voltage is used to determine whether the Vth of a memory cell exceeds the lower or higher verify voltage. In this case, a sensing parameter such as sense time and/or reference current can be adjusted. For example, the higher verify voltage can be applied to the control gate of a memory cell to determine whether the Vth exceeds the lower verify voltage by using a shorter sense time and/or a higher reference current. In this example, the higher verify voltage can also be applied to the control gate of the memory cell to determine whether the Vth exceeds the higher verify voltage by using a longer sense time and/or a lower reference current. This approach avoids having to generate an additional control gate voltage for sensing the lower verify voltages.

One of three paths is followed for each storage element. In one path, at step 746, for a storage element with a Vth below the lower verify level of its target data state (normal programming mode), the data in the respective data latches associated with the storage element is maintained to allow normal programming to occur in the next program-verify iteration. In a second path, at step 748, for a storage element with a Vth between the lower and higher verify levels of its target data state (slow programming mode), the data in the respective data latches associated with the storage element is updated or maintained to allow slow programming to occur in the next program-verify iteration. In a third path, at step 750, for a storage element with a Vth above the higher verify level of its target data state, the data in the respective data latches associated with the storage element is updated or maintained so that the storage element is inhibited in the next program-verify iteration. Once a storage element is inhibited, it is no longer sensed during subsequent program verify tests, since it has already been judged to be at its target Vth level.

Step 752 optionally re-uses a bit combination which is no longer used, as discussed further in connection with FIG. 15C. Step 754 counts a number of fail bits, e.g., storage elements for which the Vth is below the target verify level.

Figure 7C:
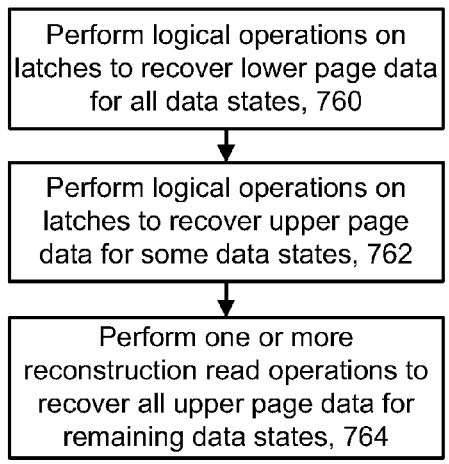
FIG. 7C provides example details of step 710 or 726 of FIG. 7A.

FIG. 7C provides example details of step 710 or 726 of FIG. 7A. An example approach for reconstructing the original write data involves preserving data in the data latches partially (e.g., for at least three out of four states) for the inhibited storage elements. For example, step 760 performs logical operations on the data latches to recover lower page data for all data states. Step 762 performs logical operations on the data latches to recover upper page data for some, but not all, data states. Step 764 performs one or more reconstruction read operations to recover all upper page data for remaining data states. This can involve performing a reconstruction read, and combining data from the read and data in the data latches to convert a "partial data-preserve" mode (where three out of four states are preserved or reconstructed) into a "full data-preserve" mode in which all four data states are preserved or reconstructed.

See, e.g., FIGS. 11-14 for further details. In some cases, no reconstruction read is used (e.g., FIG. 11) so that the lower and upper page data can be recovered solely by logical operations on the data latches.

Figure 8A:
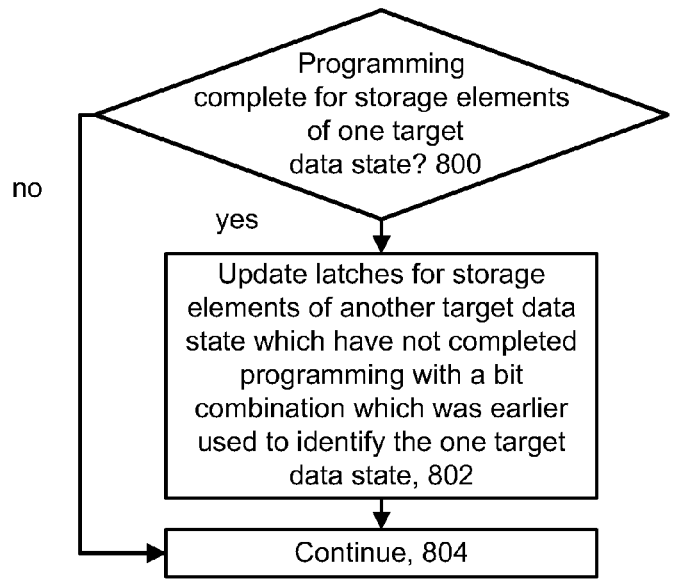
FIG. 8A provides example details of step 752 of FIG. 7B.

FIG. 8A provides example details of step 752 of FIG. 7B in which a bit combination is re-used in data latches. Decision step 800 determines if programming is complete for storage elements of one target data state. This is a predetermined target data state which typically finishes programming sooner than other target data states. For example, in the programming operation of FIGS. 4A and 4B, the A state would normally finish programming before the B and C states, and the B state would normally finish programming before the C state. See FIG. 8B, for instance, which indicates that the A state storage elements complete programming after the eight program-verify iterations so that the bit combination re-use can begin with the ninth program-verify iteration.

For the A state, for instance, the completion of programming can occur when the Vth of all, or a specified portion of the storage element whose target state is the A state, has been verified to exceed VvaH, the higher verify level for state A. A bit ignore criteria can be used so that programming is considered to be completed even if a small number (e.g., 1-10%) of the A state storage element have not passed the verify test using VvaH. If programming is not complete for the one target data state, a continue step 804 is reached. If programming is complete for the one target data state, step 802 updates data latches for storage elements of another target data state (e.g., the B or C state) which have not completed programming with a bit combination which was earlier used to identify the one target data state, before the programming is complete for the one target data state.

For example, in FIG. 15B, case 2A, the bit combination C1 identifies the selected A state elements that are under normal programming mode (An). In FIG. 15C, this bit combination is re-used to identify the inhibited C state (Ci). This allows the Ci state to have a unique bit combination. In contrast, in FIG. 15B, case 2A, the Er state and the C state both have the bit combination C0, so they could not be distinguished without performing a reconstruction read using Vr_er/c. The re-use therefore can potentially allow one less reconstruction read to be used reconstructing the write data.

Note that when programming is complete for the A state, some portion of the C state storage elements may have already completed programming. As a result, C0 will be used only by the remaining C state storage elements which have not reached lockout.

Many variations are possible with the re-use of bit combinations. A bit combinations from multiple target data states may be re-used when programming is completed for those multiple target data states. For example, a bit combination from the A state can be used for the B state when the A state completes programming, as mentioned. Further, a bit combination from the B state can be used for the C state when the B state completes programming. See also FIG. 8B.

In another approach, a bit combination can be re-used by storage elements of multiple target data states in a sequence. For instance, the bit combination from state A can be re-used for state B until a criterion is met, after which the bit combination from state A is re-used for state C and is no longer re-used by state B. In one approach, the criterion is a function of the programming progress of the B state storage elements. For example, the bit combination may be re-used for the B state until some portion of the B state storage elements has completed programming, or until a Vth of some portion of the B state storage elements is above or below a specified verify level. In another approach, the criterion is a specified number of program pulses. For example, the bit combination may be re-used for the B state for four program pulses, after which it is re-used for the C state storage elements. Combinations of the above listed approaches may also be used.

Figure 8B:
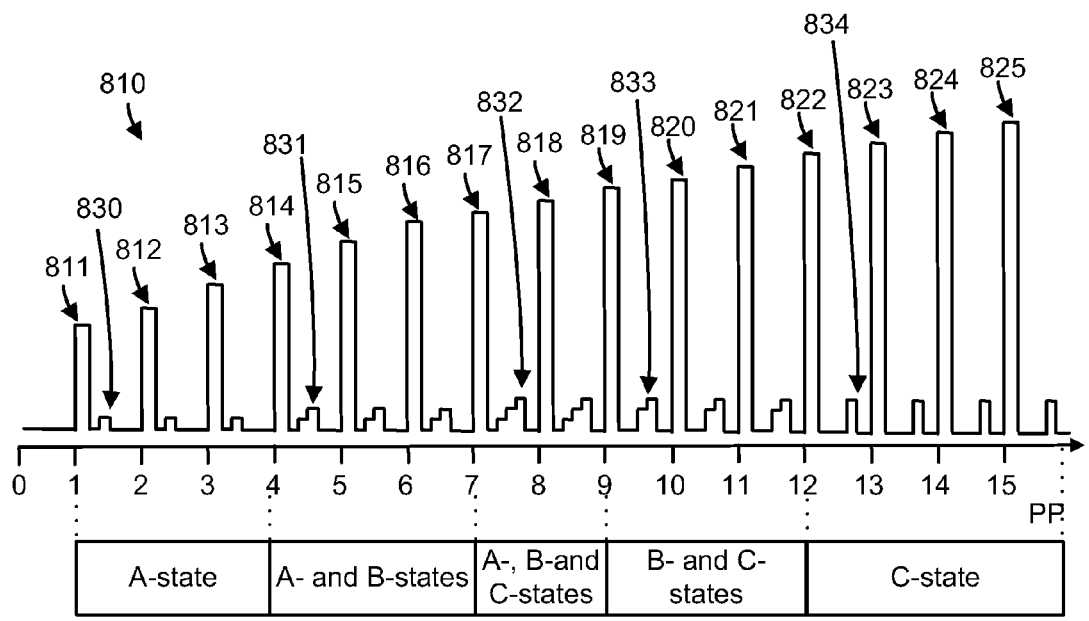
FIG. 8B depicts a programming operation corresponding to the one pass programming operation FIGS. 4A and 4B.

FIG. 8B depicts a programming operation corresponding to the one pass programming operation FIGS. 4A and 4B. The horizontal axis depicts program pulse number and the vertical axis depicts control gate or word line voltage. Generally, a programming operation can involve applying a pulse train to a selected word line, where the pulse train includes multiple program-verify iterations. The program portion of the program-verify iteration comprises a program pulse, and the verify portion of the program-verify iteration comprises one or more verify pulses.

A pulse train typically includes program pulses which increase stepwise in amplitude in each program-verify iteration using a fixed or varying step size. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

The pulse train 810 includes a series of program pulses 811-825 that are applied to a word line selected for programming, and an associated set of non-volatile storage elements. One, two or three verify levels are provided after each program pulse as an example, based on the target data states which are being verified. 0 V may be applied to the selected word line between the program and verify pulses. For example, an A-state verify pulse (e.g., waveform 830) may be applied after each of the first-third program pulses. A- and B-state verify pulses (e.g., waveform 831) may be applied after each of the fourth-sixth program pulses. A-, B- and C-state verify pulses (e.g., waveform 832) may be applied after each of the seventh and eighth program pulses. B- and C-state verify pulses (e.g., waveform 833) may be applied after each of the ninth-eleventh program pulses. Finally, a C-state verify pulse (e.g., waveform 834) may be applied after each of the twelfth-fifteenth program pulses.

In this example, the A state storage elements complete programming after the eighth program pulse so that their bit combination can be re-used starting with the ninth program pulse for the B or C state storage elements. In another example, the B state storage elements complete programming after the eleventh program pulse so that their bit combination (along with the A state bit combination) can be re-used starting with the twelfth program pulse for the C state storage elements.

FIG. 9A depicts an example arrangement of bit combinations in data latches, where there are four data states, two bit combinations are unused, two data states have a quick pass write mode (Aq and Bq), and all of the data states have a same bit combination for an inhibit mode, in a comparative example. Eight example unique bit combinations are denoted by C1-C7. This notation is also used in FIGS. 15A-16.

Generally, a bit combination is a sequence or string of two or more bits. The number of different bit combinations which can be stored in k latches is $2^k$. In this example and following examples, "Lower (XDL)" is the lower page latch, "QPW (UDL)" is the QPW mode latch, and "Upper (LDL)" is the upper page latch. Further, Er is the erased state, the other data states are A, B or C, "n" denotes the mode for normal programming speed, "q" denotes the slow programming mode, and "i" denotes an inhibit mode. A cell in the Er state is also in the inhibit state (Eri). The 0's and 1's are example bit values. The SDL latch contains read data and is not depicted here. Typically, XDL stores the lower page data, LDL stores the upper page data, UDL stores the indication of whether or not a storage element is in slow programming mode, and SDL stores the result of the last performed sensing operation. In this example, six unique bit combinations are used, so that two bit combinations are unused. Note that combinations #1 and #2 are not being used. Also, Er, Ai, Bi and Ci share the same data latch configurations, which means they cannot be distinguished at the end of programming.

FIG. 9B depicts an example arrangement of bit combinations in data latches, where there are four data states, one bit combination is unused, two data states have a quick pass write mode (Aq and Bq), the Er and A data states have a same bit combination for an inhibit mode, and the B and C data states have a same bit combination for an inhibit mode, in a lower page preserve mode. In this mode, the LP data is preserved in one of the data latches (XDL in this example) so that, at the end of program operation, the LP data can be recovered, but not UP data. Also, this mode may rely on a program status=fail to initiate the data-recovery. If program status=pass, the memory chip does not try to recover the data.

In this case, the LP data is retained throughout the program sequence. In case a program status=fail occurs during UP programming, the LP data can be recovered from the LP data latches. Note that only LP data can be recovered, while UP cannot be recovered. Also, if the memory chip relies on program status=fail to initiate a data recovery, if program status=pass, the memory chip continues to program the next page. Thus, for a broken word line case, the chip will not try to recover the data in this example.

FIG. 10A depicts an example arrangement of bit combinations in data latches for a "Program mode A", where there are four data states, no bit combinations are unused, one data state has a quick pass write mode (Bq), and all of the data states have a different bit combination when they are in inhibit mode. QPW is used on only one state which is the B state (e.g., mode Bi). Compared to FIG. 9B, QPW is not used for the A state so that the QPW latch is not applicable (n/a). Instead, the A state cells will use a fixed Vbl while programming. This frees up another bit combination.

Note that in Program mode A, there is Mqpw=1 data state (B) which uses the QPW mode, and Mno_qpw=2 data states (A, C) which are programmed without using the QPW mode.

FIG. 10B depicts an example arrangement of bit combinations in data latches for a "Program mode B", where there are four data states, no bit combinations are unused, two data states have a quick pass write mode (Aq and Bq), the Er and C data states have a same bit combination for an inhibit mode, while the A and B data states have different bit combinations when they are inhibited. Here, QPW is used on two states (Aq and Bq). Further, comparing FIG. 10B to FIG. 9A, note the following differences: Ai and Bi use up the #1 and #2 combinations so they can be uniquely distinguishable from Er and Ci memory cells. However, to distinguish between Er and Ci memory cells, we need something more, as discussed further below. On the other hand, in case of program mode A, another one of the bit combinations is freed up which is assigned to the Ci memory cells. In this manner, the data state of each memory cell (e.g., Er/Ai/Bi/Ci) can be distinguished with no reconstruction read.

Note that in Program mode B, there are Mqpw=2 data states (A, B) which use the QPW mode, and Mno_qpw=1 data state (C) which is programmed without using the QPW mode.

FIG. 11 depicts bit combinations in data latches in an example data reconstruction process in accordance with the program mode A of FIG. 10A, for program status=pass. This approach reconstructs LP/UP data by combining the preserved data in the data latches for the non-inhibited cells (An, Bq/Bn and Cn) and the inhibited cells (Er, Ai, Bi and Ci). Moreover, while the example of FIG. 10A uses QPW for the B state, it could be modified to use QPW for the A or C state, alternatively. In this approach, one state uses QPW and no bit combination is repeated.

Table 1100 depicts the data latches with the original write data. As seen, the lower/upper page bit combination is 11, 10, 00 and 01 for Er, A, B and C, respectively. These bit combinations are modified during programming for the storage elements which are programmed (e.g., to the A, B and C states) based on the programming progress. The QPW bit does not apply since programming has not started. With these modifications, some of the bits will no longer represent the page data at the end of the programming operation but will simply be bits in a bit combination of the data latch. In this and other figures, an "x" denotes a latch that does not contain relevant data, and is free to be utilized for other purposes.

Table 1110 depicts the data latches at the end of the programming operation. Due to use of the previously unused bit combinations for Ai, Bi and Ci, each data state can be distinguished from each other. This table represents memory cells which passed the verify test but does not represent fail bits. Table 1120 depicts the data latches after reconstructing the LP data and placing the result in the LP latches using the logical operation: XDL=XDL & LDL applied to table 1110. "&" denotes the AND logic operation. Table 1130 depicts the data latches after a first step of reconstructing the UP data and placing the result in the UP latches using the logical operation: LDL=LDL & UDL applied to table 1120. Table 1140 depicts the data latches after a second step of reconstructing the UP data and placing the result in the UP latches using the logical operation: LDL=LDL XNOR XDL applied to table 1130. "XNOR" denotes the NOT XOR operation. Note that UDL is free to use now. LDL and XDL contain the full, correct LP and UP data for all data states.

Subsequently, according to step 712 of FIG. 7A, normal read operations using an A-read (using Vr_er/a), a B-read (using Vr_a/b) and a C read (using Vr_b/c) can be performed and the results from the read operations can be used to check for errors against the correct data. Specifically, one read operation for LP data is made using Vr_a/b, and the read data is compared against the data in XDL, and a number of mismatches is incremented if the two bits do not match. Secondly, two read operations, at Vr_er/a and Vr_b/c, are made for UP data, and the read data is compared against the LDL data, and a number of mismatches is incremented if the two bits do not match. As discussed in connection with FIG. 7A, if the number of errors in either of UP/LP data, is below a certain threshold, which can be set as a ROM fuse parameter, no recovery action is taken. If the number of errors exceeds the threshold, the UP/LP data is recovered from the LDL and XDL latches and re-written to another location in the memory device.

FIG. 12A-12E depict bit combinations in data latches in an example data reconstruction process in accordance with the program mode B of FIG. 10B, for program status=pass. This approach reconstructs the LP/UP data by doing a B-read operation and combining the read data with the preserved data in the data latches for the non-inhibited cells (Aq/An, Bq/Bn and Cn) and the inhibited cells (Er, Ai, Bi and Ci).

FIG. 12A depicts the original write data. FIG. 12B depicts the updated latches at the end of the programming operation. The LDL latches are no longer needed and can be reset. FIG. 12C depicts a result of shifting around data in the latches such that LDL contains UP data and XDL contains LP data. Specifically, the following logical operations are performed on FIG. 12B: (1) Reset LDL, and (2) LDL=UDL; Reset UDL.

FIG. 12D shows converting the LDL data for Bi from 1->0 to correctly represent the B state UP data by performing this logical operation on FIG. 12C: LDL=LDL&XDL. This provides the correct LP/UP data for the A and B states. However, the Er and C states are indistinguishable at this point.

FIG. 12E at table 1200 is obtained by performing a read using Vr_a/b (a B-read) to obtain LP data to distinguish between the Er and C states. An assumption is that the defect in the word line is not bad enough to cause E->B/C or C->A/E fails. Recall that SDL is the latch which initially stores the read data. The following operation is performed: B-read into SDL.

FIG. 12E at table 1202 is obtained by the following operation applied to table 1200: UDL=SDL & LDL. At this time, the UDL data can be used to distinguish between the Er and C states.

FIG. 12E at table 1204 is obtained by the following operation applied to table 1202: XDL=UDL XOR XDL. UDL is free to use now. At this point, LDL and XDL contain full, correct UP and LP data for all data states. Now, an A-read (using Vr_er/a) and a C-read (using Vr_b/c) can be done and the results from A-read, B-read, C-read combined can be used to check for errors against the correct data in accordance with step 714 of FIG. 7A.

As can be seen, previously unused data latch combinations are used for Ai and Bi, while Er and C, originally were still indistinguishable. Data from the B-read is then combined with the latch data to distinguish between the Er and C states. Subsequently, an A-read (and/or C-read) may be performed. In total, data from A-read, B-read, C-read (LP/UP data from read data) is compared against data in the LDL and XDL data latches and the errors are counted, separately for LP/UP data. If the errors are below a certain threshold in accordance with decision step 716 of FIG. 7A, no recovery action is taken. If errors exceed the threshold, UP/LP data is recovered from the LDL and XDL data latches and rewritten to another location.

FIG. 13A-13H depict bit combinations in data latches in an example data reconstruction process in accordance with the program mode A of FIG. 10A, for program status=fail. One difference from the program status=pass case of FIG. 11 is that some storage elements, e.g., more than the first threshold of decision step 706 of FIG. 7A, are not yet inhibited at the end of the programming operation. In this example, all data states can be recovered using logical operations and without any reconstruction read operations.

In the examples of FIGS. 11-12E, it can be assumed that the program status=pass and read status=fail, which is typical when the defect is a broken word line or a weak word line-to-word line short. Moreover, in a defective word line, the data is stored with sufficient accuracy such that the Vth distributions of the Er and C state cells do not overlap. This is a fair assumption for majority of the cases. This assumption is not needed for FIG. 11. Further, it is assumed that cache programming is not done so that we have access to all three data latches at all times. Under cache programming, near the end of the programming operation, one of the data latches may be used by the controller to load in the next page of programming data.

FIG. 13A depicts the data latches when program status=fail is set at step 724 in FIG. 7A. The table of FIG. 13B is reached by performing the following operation on the table of FIG. 13A: SDL=LDL. In this and other tables, bold font denotes a new bit value. The table of FIG. 13C is reached by performing the following operation on the table of FIG. 13B: LDL=LDL & UDL & XDL. The table of FIG. 13D is reached by performing the following operation on the table of FIG. 13C: LDL=LDL (~UDL & XDL & ~SDL). The table of FIG. 13E is reached by performing the following operation on the table of FIG. 13D: SDL=SDL & ~XDL. The table of FIG. 13F is reached by performing the following operation on the table of FIG. 13E: LDL=LDL (~UDL & SDL). The table of FIG. 13G is reached by performing the following operation on the table of FIG. 13F: SDL=LDL & ~UDL. The table of FIG. 13H is reached by performing the following operation on the table of FIG. 13G: XDL=XDL & ~SDL. Note that, here "~" refers to the inverse logic operation, while "|" refers to the OR logic operation.

FIG. 14A-14F depict bit combinations in data latches in an example data reconstruction process in accordance with the program mode B of FIG. 10B, for program status=fail. In this example, all data states can be recovered using logical operations and one reconstruction read operation (e.g., a B-read using Vr_a/b=Vr_er/c, see FIG. 4C). FIG. 14A depicts the data latches when program status=fail is set at step 724 in FIG. 7A. The table of FIG. 14B is reached by performing the following operation on the table of FIG. 14A: SDL=LDL. The table of FIG. 14C is reached by performing the following operation on the table of FIG. 14B: LDL=LDL & UDL & XDL.

The table of FIG. 14D is reached by performing the following operation on the table of FIG. 14C: LDL=LDL| (~UDL & ~XDL & SDL). The table of FIG. 14E is reached by performing a B-read operation using Vr_a/b=Vr_er/c and storing the result in SDL. The table of FIG. 14F is reached by performing the following operation on the table of FIG. 14E: XDL=XDL & ~SDL. At this point, the LDL and XDL latches contain the full, correct LP and UP data for all data states. An A-read and C-read can be done and the results from A-read, B-read and C-read combined can be used to determine an error count separately for LP/UP data, in accordance with decision step 716 of FIG. 7A.

In the above examples, each memory cell stored two bits of data. However, the techniques are generally applicable to three or more bits per cell as well in which case additional data latches are provided and the logic operations are modified accordingly.

FIG. 15A depicts example assignments of bit combinations to latches for a case with four data states, zero redundant bit combinations, zero reads for reconstruction and one state with a quick pass write mode. Generally, the bit combinations can be assigned so that the one or more reconstruction reads which are performed have the largest margin of error possible. For example, as discussed in connection with FIG. 4C, Vr_er/c (=Vr_a/b) is about midway between the expected upper level of the Er state distribution and the lower level of the C state distribution. This provides an optimum margin above and below the read level. The optimal level for a reconstruction read can vary based on the bit combinations, which in turn can be based on which data states have a QPW mode and which do not.

For example, in case 1A, each state has a unique bit combination C0-C7. Eight, three-bit combinations were discussed in connection with FIG. 9A. In this notation, C0, for instance, could represent "111" for the lower/QPW/upper latches for the Er state. In case 1A, the QPW mode is used for the B state as denoted by assigning C3 to Bq. In case 1B, the QPW mode is used for the A state as denoted by assigning C2 to Aq. In case 1C, the QPW mode is used for the C state as denoted by assigning C6 to Cq. In these examples, there is Mqpw=1 data state which uses the QPW mode, and Mno_qpw=2 data states which are programmed without using the QPW mode. The Er state is not programmed.

FIG. 15B depicts example assignments of bit combinations to latches for a case with four data states, one redundant bit combination, one read for reconstruction and two states with a quick pass write mode. In case 2A, the QPW mode is used for the B state as denoted by assigning C4 to Bq, and for the C state as denoted by assigning C7 to Cq. In case 2B, the QPW mode is used for the A state as denoted by assigning C2 to Aq, and for the B state as denoted by assigning C5 to Bq. In case 2C, the QPW mode is used for the A state as denoted by assigning C2 to Aq, and for the C state as denoted by assigning C7 to Cq. In each of cases 2A-2C, an example read is at Vr_er/c since C0 is assigned to both the Er and C states. In these examples, there are Mqpw=2 data states which use the QPW mode, and Mno_qpw=1 data state which is programmed without using the QPW mode.

FIG. 15C depicts a re-use of the bit combination C1 from the normal program mode An of the A state in FIG. 15B, case 2A, to the inhibit mode Ci of the C state, to provide a case with no redundant bit combinations, no reads for reconstruction and two states with a quick pass write mode. The re-use of bit combinations partway through a programming operation was discussed previously, e.g., in connection with FIG. 8A. Here, no reconstruction read is needed to distinguish between the Er state and the Ci states because they have different bit assignments (C0 and C1).

Generally, the data latch combinations used for one state in one part of a programming operation (e.g., for one or more program-verify iterations) can be re-used to represent inhibited cells of another state, once the all or most of the one state cells have reached their target. For example, in FIG. 10B (program mode B case), the latch combination used for An (LDL/UDL/XDL=0/0/1) can be used for Ci cells once all of the A-state cells have locked out except for some bit-ignore cells. This can enhance the accuracy of the mismatch count and the recovered data (in case the data-recovery is performed) since for at least some locked out C-state cells, data is essentially preserved in the data latches. Hence, those C-state cells can be judged accurately without any reconstruction read operation.

In these examples, each set of latches stores an N-bit combination which is among $2^N$ unique N-bit combinations (e.g., C0-C7), N is an integer and N≥3. Further, one N-bit combination (e.g., C1) of the $2^N$ unique N-bit combinations is used at the start of the programming for sets of latches of non-volatile storage elements which are to be programmed to one of the data states (e.g., An). Another N-bit combination (e.g., C2) of the $2^N$ unique N-bit combinations is used for the sets of latches of non-volatile storage elements which complete programming to the one of the data states (e.g., A, state Ai). Subsequently, the one N-bit combination (e.g., C1) is re-used for sets of latches of non-volatile storage elements which have completed programming to another of the data states (e.g., Ci).

FIG. 15D depicts an example assignment of bit combinations to latches for a case with four data states, two redundant bit combinations, two reads for reconstruction and three states with a quick pass write mode. In case 3, the QPW mode is used for the A, B and C state as denoted by assigning C2 to Aq, C5 to Bq and C7 to Cq, respectively. Reconstruction read operations are performed at Vr_er/b to distinguish between the Er and Bi states, and at Vr_b/c to distinguish between the Bi and Ci states, which all have the same bit combination (C0). In these examples, there are Mqpw=3 data states which use the QPW mode, and Mno_qpw=0 data states which are programmed without using the QPW mode.

FIG. 16 depicts example assignments of bit combinations to latches for various cases with eight data states.

In case 4, the QPW mode is used for the C state as denoted by assigning C6 to Cq. No reconstruction read operations are performed since no bit combination is used redundantly.

In case 5, the QPW mode is used for the C and D states as denoted by assigning C6 to Cq and C9 to Dq. One reconstruction read operation is performed at Vr_er/g to distinguish between the Er and Gi states which have the same bit assignment (C0).

In case 6, the QPW mode is used for the C, D and E states as denoted by assigning C6, C8 and C11 to Cq, Dq and Eq, respectively. Reconstruction read operations are performed at Vr_er/c to distinguish between the Er and Ci states, and at Vr_c/g to distinguish between the Ci and Gi states, which all have the same bit assignment (C0).

In case 7, the QPW mode is used for the C, D, E and F states as denoted by assigning C6, C8, C10 and C13 to Cq, Dq, Eq and Fq, respectively. Reconstruction read operations are performed at Vr_er/b to distinguish between the Er and Bi states, at Vr_b/d to distinguish between the Bi and Di states and Vr_d/g to distinguish between the Di and Gi states, which all have the same bit assignment (C0).

In case 8, the QPW mode is used for the B, C, D, E and F states as denoted by assigning C4, C6, C9, C11 and C13 to Bq, Cq, Dq, Eq and Fq, respectively. Reconstruction read operations are performed at Vr_er/b to distinguish between the Er and Bi states, at Vr_b/d to distinguish between the Bi and Di states, Vr_d/e to distinguish between the Di and Ei states and Vr_e/g to distinguish between the Ei and Gi states, which all have the same bit assignment (C0).

In case 9, the QPW mode is used for the A, B, C, D, E and F states as denoted by assigning C2, C4, C6, C9, C11 and C13 to Aq, Bq, Cq, Dq, Eq and Fq, respectively. Reconstruction read operations are performed at Vr_er/a to distinguish between the Er and Ai states, Vr_a/b to distinguish between the Ai and Bi states, Vr_b/d to distinguish between the Bi and Di states, Vr_d/e to distinguish between the Di and Ei states, and Vr_e/g to distinguish between the Ei and Gi states, which all have the same bit assignment (C0).

In case 10, the QPW mode is used for the A, B, C, D, E, F and G states (all programmed states) as denoted by assigning C2, C4, C6, C9, C11, C13 and C15 to Aq, Bq, Cq, Dq, Eq, Fq and Gq, respectively. Reconstruction read operations are performed at Vr_er/a to distinguish between the Er and Ai states, Vr_a/b to distinguish between the Ai and Bi states, Vr_b/d to distinguish between the Bi and Di states, Vr_d/e to distinguish between the Di and Ei states, Vr_e/f to distinguish between the Ei and Fi states, and Vr_f/g to distinguish between the Fi and Gi states, which all have the same bit assignment (C0).

Note that examples with bit combinations for the QPW mode have been discussed. However, the techniques are generally applicable to bit combinations in latches in general. The techniques involve mathematical combinations of latches that are in use and the number that is available, in addition to performing read operation to reconstruct the data. The techniques are applicable regardless of whether those combinations are being used for QPW or some other possible program mode.

These examples indicate that each set of latches stores an N-bit combination which is among $2^N$ unique N-bit combinations, N is an integer and N≥3. Different N-bit combinations of the $2^N$ unique N-bit combinations are used for each of the plurality of data states in the sets of latches of the unselected (Er-state) non-volatile storage elements and in the sets of latches of the non-volatile storage elements which have completed programming. Further, reconstructing the write data from the sets of latches comprises performing logical operations on bits stored in the sets of latches and performing (exactly) Mqpw-1 read operations to distinguish among non-volatile storage elements of the plurality of non-volatile storage elements which have sets of latches having a same N-bit combination but which are in different data states of the plurality of data states. Moreover, the Mqpw-1 read operations use a read voltage which is between the different data states.

FIG. 17 depicts example subsets of storage elements which are programmed along a word line WLn. A set 1700 of storage elements 1700-1711 includes storage elements 1700, 1703 and 1709 which are to remain in the erase state Er. These are unselected non-volatile storage elements which are in one data state of a plurality of data states and are not to be programmed (block 1720). Storage elements 1702, 1705 and 1707 are in a first subset (1720) of the plurality of non-volatile storage elements which are to be programmed to one of Mqpw data states (e.g., the B state) of the plurality of data states using a normal programming mode and then a slow (QPW) programming mode (block 1730). Storage elements 1701, 1708 and 1711 are in a second subset (1740) of the plurality of non-volatile storage elements which are to be programmed to one of Mno_qpw data states (e.g., the C state) of the plurality of data states using the normal programming mode but not the slow programming mode (block 1740). Similarly, storage elements 1704, 1706 and 1710 are in the second subset (1740) and are to be programmed to one of Mno_qpw data states (e.g., the A state) of the plurality of data states using the normal programming mode but not the slow programming mode. In this case, Mqpw=1 and Mno_qpw=2.

Accordingly, it can be seen that, in one embodiment, a method for operating a non-volatile storage device comprises storing write data in a plurality of sets of latches, where the plurality of sets of latches comprise a set of latches for each non-volatile storage element of a plurality of non-volatile storage elements. The method further includes performing each program-verify iteration of a plurality of program-verify iterations in a programming operation by applying a program pulse to the plurality of non-volatile storage elements followed by performing a program-verify test involving the non-volatile storage elements; updating the set of latches based on results of the program-verify tests; and if a number of the non-volatile storage elements which have not completed programming falls below a first threshold number: setting a program status=pass to indicate that the programming operation has completed, reconstructing the write data from the sets of latches as reconstructed write data, performing a read operation involving the non-volatile storage elements to obtain read data, determining a number of mismatches between the read data and the reconstructed write data, and determining whether re-writing of the write data is required based on the number of mismatches.

In another embodiment, a non-volatile storage system comprises a plurality of non-volatile storage elements; plurality of sets of latches, the plurality of sets of latches comprise a set of latches for each non-volatile storage element of the plurality of non-volatile storage elements; and a control circuit. The control circuit: stores write data in the plurality of sets of latches, performs each program-verify iteration of a plurality of program-verify iterations in a programming operation by application of a program pulse to the plurality of non-volatile storage elements followed by performance of a program-verify test involving the non-volatile storage elements, updates the set of latches based on results of the program-verify tests, and if a number of the non-volatile storage elements which have not completed programming falls below a first threshold number: sets a program status=pass to indicate that the programming operation has completed, reconstructs the write data from the sets of latches as reconstructed write data, performs a read operation involving the non-volatile storage elements to obtain read data, determines a number of mismatches between the read data and the reconstructed write data, and determines whether re-writing of the write data is required based on the number of the mismatches.

In another embodiment, a method for operating a non-volatile storage device comprises: storing write data in a set of latches for each non-volatile storage element of a plurality of non-volatile storage elements, such that for each non-volatile storage element, at a start of a programming operation, the set of latches indicates that each non-volatile storage element is an unselected non-volatile storage element which is in one data state of a plurality of data states and is not to be programmed, or is a selected non-volatile storage element which is to be programmed to one of a number of other data states of the plurality of data states; performing each program-verify iteration of a plurality of program-verify iterations in the programming operation by applying a program pulse to the plurality of non-volatile storage elements followed by performing a program-verify test for at least some of the selected non-volatile storage elements; in response to the program-verify tests, updating the set of latches for each selected non-volatile storage element which has completed programming to its data state; and during the programming operation, if a number of the selected non-volatile storage elements which have not completed programming falls below a first threshold number: setting a program status to indicate that the programming operation has completed, reconstructing the write data from the sets of latches as reconstructed write data, performing a read operation involving at least some of the plurality of non-volatile storage elements to obtain read data, determining a number of mismatches between the read data and the reconstructed write data, and determining whether re-writing of the write data is required based on the number of the mismatches.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for operating a non-volatile storage device, comprising:

storing write data in a plurality of sets of latches, the plurality of sets of latches comprise a set of latches for each non-volatile storage element of a plurality of non-volatile storage elements;

performing each program-verify iteration of a plurality of program-verify iterations in a programming operation by applying a program pulse to the plurality of non-volatile storage elements followed by performing a program-verify test involving the non-volatile storage elements;

updating the set of latches based on results of the program-verify tests; and if a number of the non-volatile storage elements which have not completed programming falls below a first threshold number: setting a program status=pass to indicate that the programming operation has completed, reconstructing the write data from the sets of latches as reconstructed write data, performing a read operation involving the non-volatile storage elements to obtain read data, determining a number of mismatches between the read data and the reconstructed write data, and determining whether re-writing of the write data is required based on the number of the mismatches, wherein:

each set of latches stores an N-bit combination which is among $2^N$ unique N-bit combinations, N is an integer and $N \geq 3$; and the reconstructing the write data from the sets of latches comprises performing logical operations on bits stored in the sets of latches, and performing at least one read operation to distinguish among non-volatile storage elements of the plurality of non-volatile storage elements which have sets of latches having a same N-bit combination but which are in different data states of a plurality of data states, wherein the different data states are separated from one another by at least one other data state of the plurality of data states.

2. The method of claim 1, further comprising:

during the programming operation, if the number of the non-volatile storage elements which have not completed programming does not fall below the threshold number when the programming operation is completed: setting the program status=fail to indicate that the programming operation has not successfully completed, and reconstructing the write data from the sets of latches and from a read operation which distinguishes among non-volatile storage elements of the plurality of non-volatile storage elements which have sets of latches having a same N-bit combination but which are in different data states.

3. The method of claim 1, wherein:
the write data is received from a controller; and
the method further comprises informing the controller that the write data has been successfully written to the plurality of non-volatile storage elements and that re-writing of the write data is not required when the number of the mismatches does not exceed a second threshold number.

4. The method of claim 3, wherein:
the second threshold number is set based on a number of the non-volatile storage elements which have not completed programming, such that a sum of the second threshold number and the number of the non-volatile storage elements which have not completed programming is kept under a maximum error-correctable number of fail bits.

5. The method of claim 1, wherein:
the at least one read operation comprises a number of read operations which is equal to a number of data states in the plurality of data states which use a slow programming mode in the programming operation.

6. The method of claim 1, wherein:
the at least one read operation uses a read voltage which is midway between threshold voltage distributions of the different data states which are separated from one another by the at least one other data state of the plurality of data states.

7. The method of claim 1, wherein:
the different data states are furthest from one another among the plurality of data states.

8. The method of claim 1, further comprising:
setting a read status to indicate whether the re-writing of the data is required.

9. The method of claim 1, wherein:
the write data is received from a controller; and
the method further comprises informing the controller that re-writing of the write data is required when the number of the mismatches exceeds a second threshold number.

10. The method of claim 1, wherein:
each mismatch represents one of the non-volatile storage elements for which a data state which is consistent with the read data is different than a data state indicated by the set of latches.

11. The method of claim 1, wherein:
the method further comprises using one of the N-bit combinations to identify storage elements which have completed programming to one target data state, and re-using the one of the N-bit combinations to identify storage elements which have completed programming to another target data state.

12. A non-volatile storage system, comprising:
a plurality of non-volatile storage elements;
plurality of sets of latches, the plurality of sets of latches comprise a set of latches for each non-volatile storage element of the plurality of non-volatile storage elements; and
a control circuit, the control circuit is configured to:
store write data in the plurality of sets of latches,
perform each program-verify iteration of a plurality of program-verify iterations in a programming operation by application of a program pulse to the plurality of non-volatile storage elements followed by performance of a program-verify test involving the non-volatile storage elements,
update the set of latches based on results of the program-verify tests, and
if a number of the non-volatile storage elements which have not completed programming falls below a first threshold number:
set a program status=pass to indicate that the programming operation has completed,
reconstruct the write data from the sets of latches as reconstructed write data,
perform a read operation involving the non-volatile storage elements to obtain read data,
determine a number of mismatches between the read data and the reconstructed write data, and
determine whether re-writing of the write data is required based on the number of the mismatches, wherein each set of latches stores an N-bit combination which is among $2^N$ unique N-bit combinations, N is an integer and $N \geq 3$; and
the control circuit, to reconstruct the write data from the sets of latches, performs logical operations on bits stored in the sets of latches and performs Mqpw-1 read operations to distinguish among non-volatile storage elements of the plurality of non-volatile storage elements which have sets of latches having a same N-bit combination but which are in different data states of a plurality of data states, the Mqpw-1 read operations use a read voltage which is between the different data states and $Mqpw \geq 2$ is an integer identifying a number of data states in the plurality of data states which use a slow programming mode in the programming operation.

13. The non-volatile storage system of claim 12, wherein:
during the programming operation, if the number of the non-volatile storage elements which have not completed programming does not fall below the threshold number when the programming operation is completed: the control circuit is configured to set the program status=fail to indicate that the programming operation has not successfully completed, and reconstruct the write data from the sets of latches and from the Mqpw-1 read operations.

14. The non-volatile storage system of claim 12, wherein:
the write data is received from a controller; and
the control circuit is configured to inform the controller that the write data has been successfully written to the plurality of non-volatile storage elements and that re-writing of the write data is not required when the number of the mismatches does not exceed a second threshold number.

15. The non-volatile storage system of claim 14, wherein:
the second threshold number is set based on a number of the non-volatile storage elements which have not completed programming, such that a sum of the second threshold number and the number of the non-volatile storage elements which have not completed programming is kept under a maximum error-correctable number of fail bits.

16. A method for operating a non-volatile storage device, comprising:
storing write data in a set of latches for each non-volatile storage element of a plurality of non-volatile storage elements, such that for each non-volatile storage element, at a start of a programming operation, the set of latches indicates that each non-volatile storage element is an unselected non-volatile storage element which is in one data state of a plurality of data states and is not to be programmed, or is a selected non-volatile storage element which is to be programmed to one of a number of other data states of the plurality of data states;

performing each program-verify iteration of a plurality of program-verify iterations in the programming operation by applying a program pulse to the plurality of non-volatile storage elements followed by performing a program-verify test for at least some of the selected non-volatile storage elements;

in response to the program-verify tests, updating the set of latches for each selected non-volatile storage element which has completed programming to its data state; and during the programming operation, if a number of the selected non-volatile storage elements which have not completed programming falls below a first threshold number: setting a program status to indicate that the programming operation has completed, reconstructing the write data from the sets of latches as reconstructed write data, performing a read operation involving at least some of the plurality of non-volatile storage elements to obtain read data, determining a number of mismatches between the read data and the reconstructed write data, and determining whether re-writing of the write data is required based on the number of the mismatches, wherein each set of latches stores an N-bit combination which is among $2^N$ unique N-bit combinations, N is an integer and N≥3, and the reconstructing the write data from the sets of latches comprises performing logical operations on bits stored in the sets of latches and performing Mqpw-1 read operations to distinguish among non-volatile storage elements of the plurality of non-volatile storage elements which have sets of latches having a same N-bit combination but which are in different data states of a plurality of data states, the Mqpw-1 read operations use a read voltage which is between the different data states and Mqpw≥2 is an integer identifying a number of data states in the plurality of data states which use a slow programming mode in the programming operation.

17. The method of claim 16, wherein:
the write data is received from a controller; and
the method further comprises informing the controller that re-writing of the write data is required when the number of the mismatches exceeds a second threshold number.

18. The method of claim 16, wherein:
the write data is received from a controller; and
the method further comprises informing the controller that the write data has been successfully written to the plurality of non-volatile storage elements when the number of the mismatches does not exceed a second threshold number.

19. The method of claim 16, wherein:
the different data states of the plurality of data states are separated from one another by at least one other data state of the plurality of data states.

20. The method of claim 19, wherein:
the different data states which are separated from one another by the at least one other data state of the plurality of data states are distinguished from one another using a read voltage which is midway between threshold voltage distributions of the different data states.

* * * * *